US006437617B2

(12) United States Patent
Saeki

(10) Patent No.: US 6,437,617 B2
(45) Date of Patent: Aug. 20, 2002

(54) METHOD OF CONTROLLING A CLOCK SIGNAL AND CIRCUIT FOR CONTROLLING A CLOCK SIGNAL

(75) Inventor: Takanori Saeki, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/777,331

(22) Filed: Feb. 6, 2001

Related U.S. Application Data

(62) Division of application No. 09/256,711, filed on Feb. 24, 1999, now Pat. No. 6,278,309.

(30) Foreign Application Priority Data

Feb. 27, 1998 (JP) ............................................. 10-64335

(51) Int. Cl.[7] .............................................. H03L 7/06
(52) U.S. Cl. ....................... 327/158; 327/161; 327/261; 327/234; 375/375; 331/DIG. 2
(58) Field of Search ................................. 327/261, 263, 327/264, 291, 299, 284, 231, 233, 234, 236, 237, 241, 243, 161, 158, 155; 375/371, 375, 362; 365/233; 331/11, 12, DIG. 2

(56) References Cited

U.S. PATENT DOCUMENTS 5,875,219 A * 2/1999 Kim ............................ 375/376

\* cited by examiner

Primary Examiner—Timothy P. Callahan
Assistant Examiner—Minh Nguyen
(74) Attorney, Agent, or Firm—Hayes Soloway P.C.

(57) ABSTRACT

A method of controlling a clock, including the steps of (a) receiving an external clock signal, (b) calculating a first period of time defined as (T1–T2) wherein T1 is a cycle of the external clock signal, and T2 is a period of time during which the external clock signal is transmitted through devices generating skew to the external clock signal, (c) stopping the external clock signal to be transmitted by the first period of time, and (d) driving the external clock signal to thereby turn the external clock signal into an internal clock signal. The method makes it possible to detect delay in a clock signal, and generate no delay error inherent to a digital circuit.

15 Claims, 32 Drawing Sheets

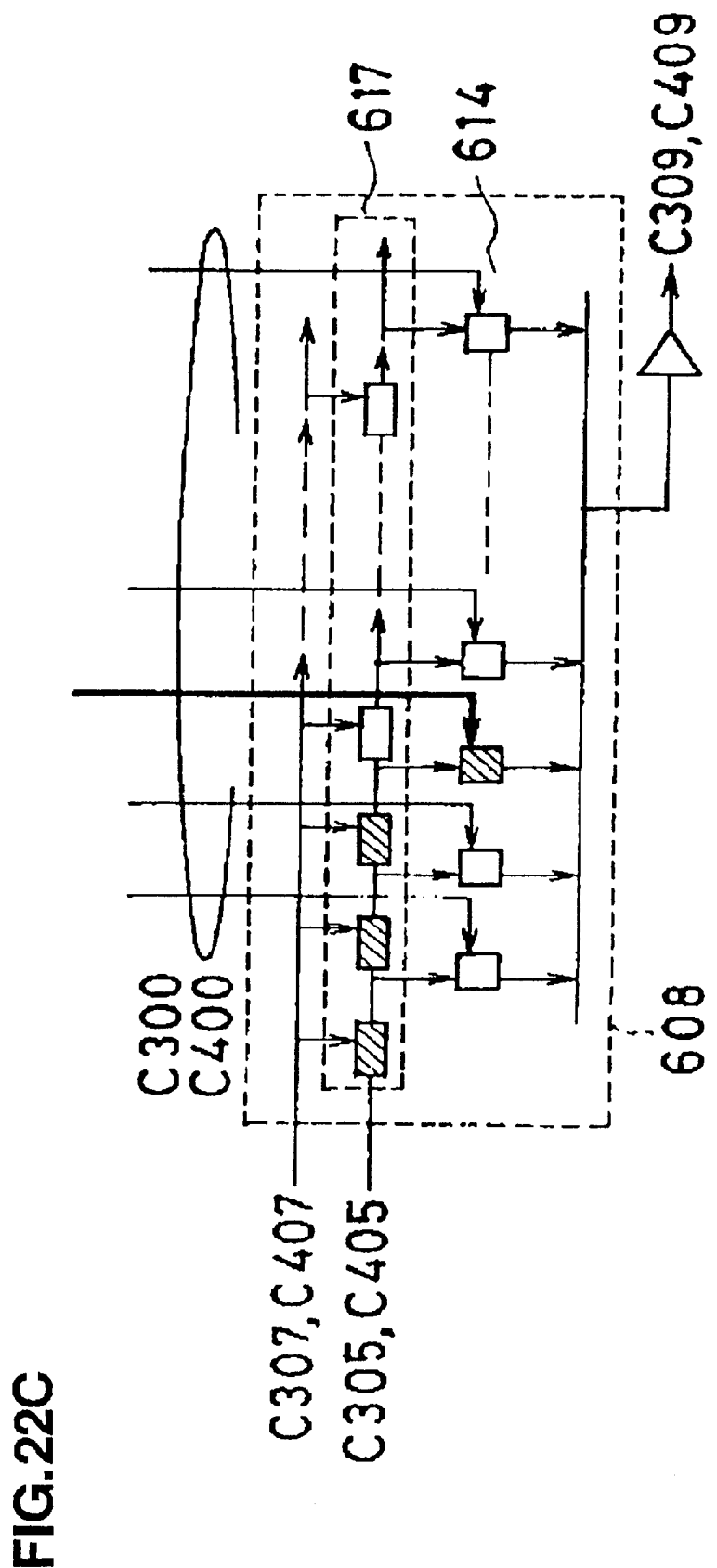

METHOD OF CONTROLLING A CLOCK SIGNAL AND CIRCUIT FOR CONTROLLING A CLOCK SIGNAL

CROSS REFERENCE TO RELATED APPLICATION

This is a divisional of application Ser. No. 09/256,711 filed Feb. 24, 1999, now U.S. Pat. No. 6,278,309.

BACKGROUND OF THE INVENTION

1. Field of the Invention

The invention relates to a method of controlling a clock signal in a circuit receiving an external clock signal and transmitting an internal clock signal. The invention relates also to a circuit for controlling a clock signal.

2. Description of the Related Art

A circuit for controlling a clock signal is generally comprised of a feedback system synchronization circuit such as phase locked loop, and is presently requested to eliminate clock skew in short synchronization time.

In order to meet with such request, a lot of circuits have been suggested in the following documents, for instance:
(a) Japanese Unexamined Patent Publication No. 8-237091
(b) 1996 Symposium on VLSI Circuit, pp. 112–113
(c) 1996 Symposium on VLSI Circuit, pp. 192–193
(d) Proceedings of IEEE 1992 CICC 25.2
(e) IEICE TRANS. ELECTRON, Vol. E79-C, No. 6, June 1996, pp. 798–807
(f) Japanese Unexamined Patent Publication No. 5-152438
(g) Japanese Unexamined Patent Publication No. 6-244282

FIGS. 1 to 6A and 6B illustrate circuits suggested in the above-listed prior art (a) to (e), respectively. As mentioned later in detail, the above-mentioned documents (a) to (g) do not suggest detecting clock delay unlike the present invention.

FIG. 1 illustrates a synchronization delay circuit having been suggested in Japanese Unexamined Patent Publication No. 8-237091.

The illustrated synchronization delay circuit is comprised of a synchronization delay circuit macro 908, an input buffer 903, a dummy delay circuit 905, and a clock driver 904. The synchronization delay circuit macro 908 is comprised of a first row of delay circuits 901 for measuring a time difference, and a second row of delay circuits 902 for reproducing the thus measured delay time. A clock signal is transmitted in the second row of delay circuits 902 in a direction opposite to a direction in which a clock signal is transmitted in the first row of delay circuits 901. The dummy delay circuit 905 is designed to have delay time equal to a sum (td1+td2) of delay time td1 of the input buffer 903 and delay time td2 of the clock driver 904.

The dummy delay circuit 905 is usually comprised of an input buffer dummy 905A having the same structure and hence the same delay time as that of the input buffer 903, and a clock driver dummy 905B, in order to equalize the delay time thereof to a sum (td1+td2) of the delay time td1 of the input buffer 903 and delay time td2 of the clock driver 904.

An external clock signal 906 is input into the first row of delay circuits 901 through the input buffer 903 and the dummy delay circuit 905, and output through the second row of delay circuits 902. The thus output clock signal is driven by the clock driver 904 to thereby turn into an internal clock signal 907, which is transmitted to internal circuits (not illustrated).

With reference to FIG. 1, the first row of delay circuits 901 has the same delay time as that of the second row of delay circuits 902. The first row of delay circuits 901 measures a certain period of time, and the second row of delay circuits 902 reproduces the thus measured period of time. A signal input into the first row of delay circuits 901 is advanced through the first row of delay circuits 901 by a desired period of time, and then, a signal is advanced in the second row of delay circuits 902 through the same number of delay devices as the number of delay devices through which the signal has passed in the first row of delay circuits 901. As a result, the second row of delay circuits 902 can reproduce a period of time having been measured by the first row of delay circuits 901.

Processes by which a signal is advanced in the second row of delay circuits 902 through the same number of delay devices as the number of delay devices through which the signal has passed in the first row of delay circuits 901 is grouped into two groups with respect to a direction or directions in which a signal is transmitted in the first and second rows of delay circuits 901 and 902. In addition, a length of the second row of delay circuits 902 is determined either by selecting an end of the length or by entirely selecting a row. Hence, the above-mentioned processes can be grouped into four groups.

For instance, as to the former grouping, each of FIGS. 4 and 5 illustrates a circuit in which a clock signal is advanced in the first row of delay circuits 901 in the same direction as a direction in which a clock signal is advanced in the second row of delay circuits 902, and the number of elements constituting the second row of delay circuits 902 is determined by an output terminal of the second row of delay circuits 902. Each of FIGS. 2 and 3 illustrates a circuit in which a clock signal is advanced in the first row of delay circuits 901 in a direction opposite to a direction in which a clock signal is advanced in the second row of delay circuits 902, and the number of elements constituting the second row of delay circuits 902 is determined by an input terminal of the second row of delay circuits 902.

As to the latter grouping, each of FIGS. 2 and 5 illustrates a circuit in which a length of the second row of delay circuits 902 is determined by selecting an end of the length, whereas each of FIGS. 3 and 4 illustrates a circuit in which a length of the second row of delay circuits 902 is determined by selecting an entire length.

FIG. 2 illustrates a circuit having been suggested in the above-listed document (a), FIG. 3 illustrates a circuit having been suggested in the above-listed document (e), FIG. 4 illustrates a circuit having been suggested in the above-listed document (c), and FIG. 5 illustrates a circuit having been suggested in the above-listed documents (b) and (d).

Hereinbelow is explained an operation for removing clock skew with reference to timing charts illustrated in FIGS. 6A, 6B, 7A, and 7B.

(A) Clock Delay in a Circuit Having no Synchronization Delay Circuits

FIG. 6A illustrates a circuit having no synchronization delay circuits. An external clock signal 906 is input through an input buffer 903, and is driven by a clock driver 904 to thereby turn into an internal clock signal 907. A delay time difference between the external clock signal 906 and the internal clock signal 907 is equal to a sum of delay time td1 of the input buffer 903 and delay time td2 of the clock driver 904. As illustrated in FIG. 6B, the sum (td1+td2) is clock skew in the illustrated circuit.

(B) Principle in Removal of Clock Delay by Means of a Synchronization Delay Circuit A synchronization delay circuit removes clock skew, based on that a clock pulse is input thereinto every clock cycle tCK. Specifically, a delay circuit having delay time defined as (tCK−(td1+td2)) is positioned between an input buffer having delay time td1 and a clock driver having delay time td2, and is designed to have delay time equal to a clock cycle tCK (td1+tCK−(td1+td2)+td2=tCK). As a result, an internal clock signal transmitted from the clock driver has the same timing as that of an external clock signal.

(C) Removal of Clock Delay by Means of a Synchronization Delay Circuit

FIG. 7B is a timing chart of a synchronization delay circuit.

A synchronization delay circuit needs 2 clock cycles (2×tCK) to operate. In a first cycle, a synchronization delay circuit measures delay time (tCK−(td1+td2)) dependent on a clock cycle, and determines delay for a delay circuit which reproduces delay time (tCK−(td1+td2)). In a second cycle, the thus measured delay time (tCK−(td1+td2)) is used.

As illustrated in FIG. 7A, a dummy delay circuit 905 and a row of delay circuits 901 are used for measuring the delay time (tCK−(td1+td2)) dependent on a clock cycle, in the first cycle.

A first pulse in successive two pulses in an external clock signal 906 is input through an input buffer 903, and is transmitted through a dummy delay circuit 905 and a row of delay circuits 901 during a clock cycle tCK starting when the first pulse leaves the input buffer 903 and terminating when a second pulse leaves the input buffer 903. Since the dummy delay circuit 905 has delay time defined as (td1+td2), a period of time in which the external clock signal 906 is advanced through a first row of delay circuits 901 is defined as (tCK−(td1+td2)).

A second row of delay circuits 902 is designed to have delay time equal to the above-mentioned period of time (tCK−(td1+td2)) in which the external clock signal 906 is advanced through the first row of delay circuits 901.

The delay time of the second row of delay circuits 902 can be set in accordance with any one of the above-mentioned four processes.

In the second cycle, a clock signal transmitted from the input buffer 930 advances through the second row of delay circuits 902 having delay time defined as (tCK−(td1+td2)), and then, is output through the clock driver 904. Thus, there is produced an internal clock signal 907 having delay time tCK.

The thus produced internal clock signal 907 has a cycle of 2×tCK and has no clock skew.

However, the above-mentioned synchronization delay circuits are accompanied with the following problems.

The first problem is that since dummy delay of a clock signal is fixed, it is necessary to estimate fixed dummy delay in advance. It would be possible to design a dummy delay circuit for each one of chips in a device in which clock delay can be estimated in advance, such as a micro-processor and a memory device. However, it would be quite difficult to design a dummy delay circuit for such a device in which clock delay is dependent on wiring layout of a chip, as an application specific integrated circuit (ASIC).

The second problem is that, as illustrated in FIGS. 8A and 8B, there is a difference both in dependency of delay time on a temperature and in dependency of delay time on a source voltage between a clock driver and a clock driver dummy, and in addition, even in a device in which clock delay can be estimated in advance, such as a micro-processor and a memory device.

The third problem is that it is impossible to eliminate a delay time difference in an internal clock signal made synchronized with an external clock signal, as having been indicated in the above-mentioned document (e), because a delay circuit for measuring a delay difference and a delay circuit for reproduction are both accomplished by determining the number of stages in a delay circuit row, and further because there is a time difference in a period of time for charging and discharging between those delay circuits. This causes dependency of a delay error or a delay time difference inherent to a digital circuit, on a clock cycle.

The fourth problem is that it is necessary to entirely drive a row of delay circuits when a clock cycle is to be reproduced by means of the row of delay circuits, resulting in an increase in load capacity and an increase in current consumption.

SUMMARY OF THE INVENTION

In view of the foregoing problems of the conventional circuits, it is an object of the present invention to provide a method of controlling a clock signal, which is capable of detecting clock delay, preventing an increase in load capacity, and avoiding generation of delay error inherent to a digital circuit.

It is also an object of the present invention to provide a circuit for controlling a clock signal, which is capable of doing the same.

In one aspect of the invention, there is provided a method of controlling a clock, including the steps of (a) receiving an external clock signal, (b) calculating a first period of time defined as (T1−T2) wherein T1 is a cycle of the external clock signal, and T2 is a period of time during which the external clock signal is transmitted through devices generating skew to the external clock signal, (c) stopping the external clock signal to be transmitted by the first period of time, and (d) driving the external clock signal to thereby turn the external clock signal into an internal clock signal.

It is preferable that a second period of time defined as (T1−(T2−N×T1)) is calculated in the step (b), if T1 is smaller than T2, wherein N is an integer meeting with the equation T1>(T2−N×T1), and wherein the external clock signal is stopped to be transmitted by the second period of time in step (c).

In another aspect of the invention, there is provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, (c) a clock-delay compensator for stopping the external clock signal to be transmitted by the first period of time, and (d) a clock driver for driving the external clock signal to thereby turn the external clock signal into an internal clock signal.

It is preferable that the clock delay detector detects a second period of time defined as (T1−(T2−N×T1)), if T1 is smaller than T2, wherein N is an integer meeting with the equation T1>(T2−N×T1), and wherein the compensator stops the external clock signal to be transmitted by the second period of time.

There is further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector receiving a first output clock signal transmitted from the input buffer, a second output clock signal transmitted from the clock-delay compensator, and a third output clock signal transmitted from the input buffer dummy to thereby detect the first period of time.

For instance, the clock delay detector may be comprised of a clock cycle detector for detecting a first clock cycle T1 of the first output clock signal, and a skew delay detector for detecting skew T2 in each of the input buffer and the clock driver, in which case, the skew delay detector may include (a) first and second delay generators for generating first and second output signals each having delay defined as (T1−T2+α) for every 2×T1, based on signals having delay defined as (T1+α) and obtained by dividing the first output clock signal, wherein α indicates a delay error inherent to a digital circuit, (b) a cycle delay generator for generating a third output signal having delay defined as (T1+α) and delayed from the first output clock signal by T1, (c) a synthesizer for synthesizing output signals transmitted from the first and second delay generators, and (d) a timing difference detector for detecting a timing difference between an output signal transmitted from the synthesizer and an output signal transmitted from the cycle delay generator, the skew delay detector generating delay time (T1−T2), based on the timing difference, and activating the stop signal by a period of time equal to the delay time (T1−T2).

The clock delay detector may be comprised of a clock cycle detector for detecting a first clock cycle T1 of the first output clock signal, and a skew delay detector for detecting skew T2 in each of the input buffer and the clock driver, in which case, the skew delay detector may include (a) a delay generator for generating an output signal having delay defined as (T1−T2+α) for every 2×T1, based on signals having delay defined as (T1+α) and obtained by dividing the first output clock signal, wherein a indicates a delay error inherent to a digital circuit, (b) a cycle delay generator for generating a third output signal having delay defined as (T1+α) and delayed from the first output clock signal by T1, (c) a multiplier for multiplying an output signal transmitted from the delay generator, by a certain number, (d) a timing difference detector for detecting a timing difference between an output signal transmitted from the synthesizer and an output signal transmitted from the multiplier, the skew delay detector generating delay time (T1−T2), based on the timing difference, and activating the stop signal by a period of time equal to the delay time (T1−T2).

It is preferable that each of the first and second delay generators is comprised of a plurality of switches one of which is turned on when receiving an output signal transmitted from the clock cycle detector, and a plurality of delay circuits, a clock signal input into each of the first and second delay generators being looped at a position associated with the turned-on switch, and being transmitted in the delay circuits toward an output port.

For instance, the cycle delay generator may be comprised of a plurality of switches one of which is turned on when receiving an output signal transmitted from the clock cycle detector, and a plurality of delay circuits, a clock signal input into the cycle delay generator being looped at a position associated with the turned-on switch, and being transmitted in the delay circuits toward an output port.

For instance, the clock cycle detector may be comprised of a plurality of delay circuits and a plurality of latch circuits, and wherein one of the latch circuits located at a position associated with one of the delay circuits where the first output clock signal reaches, transmits a signal indicative of the clock cycle T1, when a next first output clock signal is input thereto.

It is preferable that at least one of the first, second, and cycle delay generators is comprised of a plurality of MOS transistors at least one of which is turned on when receiving an output signal transmitted from the clock cycle detector, the first period of time being comprised of a period of time in which the turned-on MOS transistor is charged.

For instance, the period of time in which the turned-on MOS transistor is charged may be controlled by varying load capacity of the MOS transistor. As an alternative, the period of time in which the turned-on MOS transistor may be charged is controlled by varying a current supplied from a power source to the MOS transistor.

It is preferable that at least one of the first, second and cycle delay generators is comprised of a plurality of switches one of which is turned on when receiving an output signal transmitted from the clock cycle detector, and a plurality of delay circuits, and wherein a clock signal input into the delay circuits is output from a delay circuit among the delay circuits, associated with the turned-on switch.

It is preferable that at least one of the first, second and cycle delay generators is comprised of a plurality of first delay circuits, a plurality of second delay circuits in which a clock signal is transmitted in a direction opposite to a direction in which a clock signal is transmitted in the first delay circuits, and a plurality of switches one of which is turned on when receiving an output signal transmitted from the clock cycle detector, a clock signal input thereinto being transmitted through the first delay circuits, being input into the second delay circuits from a first delay circuit among the first delay circuits, located in association with the turned-on switch, through the turned-on switch, and being transmitted through the second delay circuits toward an output port thereof.

There is still further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector including (ba) a clock cycle detector for detecting a clock cycle of a first output clock signal transmitted from the input buffer, and (bb) a skew delay detector for skew delay in each of the input buffer and the clock driver, the skew delay detector including (bb1) a first timing difference detector for transmitting a clock signal having a pulse width indicative of a time difference defined as (td1+td2) wherein td1 indicates delay time of the input buffer and td2 indicates delay time of the clock driver, (bb2) a clock cycle detector dummy having the same delay time td3 as that of the clock cycle detector and receiving the first output clock signal, (bb3) a divider for dividing both the first output clock signal and an output clock signal transmitted from the clock cycle detector dummy to thereby transmit complementary clock signals each having a cycle of 2×T1 and a pulse width defined as (T1+td3), and each having a leading edge equal to that of the first output clock signal and a trailing edge delayed from that of the first output clock signal by td3, (bb4) first and second synthesizers for synthesizing the complementary clock signals and the clock signal transmitted from the first timing difference detector to thereby transmit output signals each having a cycle of 2×T1 and also having an active level period defined as (td1+td2+T1+td3), (bb5) first and second control gates each receiving the complementary clock signals to thereby be controlled as to receiving the first output clock signal, (bb6) first and second delay generators each including a plurality of switches one of which is turned on when receiving an output clock signal transmitted from the clock cycle detector, and a plurality of delay circuits, each of the first and second delay generators receiving both output clock signals transmitted from the first and second control gates and output clock signals transmitted from the first and second synthesizers, the output clock signals transmitted from the first and second control gates being controlled by the output clock signals transmitted from the first and second synthesizers as to advancing and stopping in the delay circuits, (bb7) a cycle delay generator including a plurality of switches one of which is turned on when receiving an output signal transmitted from the clock cycle detector, and a plurality of delay circuits, the cycle delay generator receiving the first output clock signal, which is looped at a position associated with the turned-on switch, and is transmitted in the delay circuits toward an output port, (bb8) a third synthesizer for synthesizing output signals transmitted from the first and second delay generators, and (bb9) a second timing difference detector for detecting a difference between an output signal transmitted from the third synthesizer and an output signal transmitted from the cycle delay generator, and transmitting a signal indicative of the thus detected difference to the clock-delay compensator as the stop signal.

There is yet further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector including (ba) a clock cycle detector for detecting a clock cycle of a first output clock signal transmitted from the input buffer, and (bb) a skew delay detector for skew delay in each of the input buffer and the clock driver, the skew delay detector including (bb1) a first timing difference detector for transmitting a clock signal having a pulse width indicative of a time difference defined as (td1+td2) wherein td1 indicates delay time of the input buffer and td2 indicates delay time of the clock driver, (bb2) a clock cycle detector dummy having the same delay time td3 as that of the clock cycle detector and receiving the first output clock signal, (bb3) a divider for dividing both the first output clock signal and an output clock signal transmitted from the clock cycle detector dummy to thereby transmit complementary clock signals each having a cycle of 2×T1 and a pulse width defined as (T1+α) where α indicates a delay error inherent to a digital circuit, and each having a leading edge equal to that of the first output clock signal and a trailing edge delayed from that of the first output clock signal by (T1+α), (bb3) first and second synthesizers for synthesizing the complementary clock signals and the clock signal transmitted from the first timing difference detector to thereby transmit output signals each having a cycle of 2×T1 and also having an active level period defined as (td1+td2+T1+α), and (bb4) a cycle delay generator including a plurality of switches one of which is turned on when receiving the first output clock signal, and a plurality of delay circuits, the cycle delay generator receiving the first output clock signal, which is looped at a position associated with the turned-on switch, and is transmitted in the delay circuits toward an output port, the clock delay compensator including (c1) first and second control gates each receiving the complementary clock signals to thereby be controlled as to receiving the first output clock signal, (c2) first and second delay generators each including a plurality of switches one of which is turned on when receiving an output clock signal transmitted from the clock cycle detector, and a plurality of delay circuits, each of the first and second delay generators receiving both output clock signals transmitted from the first and second control gates and output clock signals transmitted from the first and second synthesizers, the output clock signals transmitted from the first and second control gates being controlled by the output clock signals transmitted from the first and second synthesizers as to advancing and stopping in the delay circuits, and (c3) a third synthesizer for synthesizing output signals transmitted from the first and second delay generators, the thus synthesized output signals being transmitted to the clock driver.

There is still yet further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector including (ba) a clock cycle detector for detecting a clock cycle of a first output clock signal transmitted from the input buffer, and (bb) a skew delay detector for skew delay in each of the input buffer and the clock driver, the skew delay detector including (bb1) a first timing difference detector for transmitting a clock signal having a pulse width indicative of a time difference defined as (td1+td2) wherein td1 indicates delay time of the input buffer and td2 indicates delay time of the clock driver, (bb2) a clock cycle detector dummy having the same delay time td3 as that of the clock cycle detector and receiving the first output clock signal, (bb3) a divider for dividing both the first output clock signal and an output clock signal transmitted from the clock cycle detector dummy to thereby transmit complementary clock signals each having a cycle of 2×T1 and a pulse width defined as (T1+td3), and each having a leading edge equal to that of the first output clock signal and a trailing edge delayed from that of the first output clock signal by td3, (bb4) first and second synthesizers for synthesizing the complementary clock signals and the clock signal transmitted from the first timing difference detector to thereby transmit output signals each having a cycle of 2×T1 and also having an active level period defined as (td1+td2+T1+td3), (bb5) a control gate receiving the complementary clock signals to thereby be controlled as to receiving the first output clock signal, (bb6) a delay generator including a plurality of switches one of which is turned on when receiving an output clock signal transmitted from the clock cycle detector, and a plurality of delay circuits, the delay generator receiving both output clock signal transmitted from the control gate and output clock signals transmitted from the first and second synthesizers, the output clock signal transmitted from the control gate being controlled by the output clock signals transmitted from the first and second synthesizers as to advancing and stopping in the delay circuits, (bb7) a cycle delay generator including a plurality of switches one of which is turned on when receiving an output signal transmitted from the clock cycle detector, and a plurality of delay circuits, the cycle delay generator receiving the first output clock signal, which is looped at a position associated with the turnedon switch, and is transmitted in the delay circuits toward an output port, (bb8) a multiplier for multiplying an output signal transmitted from the delay generator, by a certain number, and (bb9) a second timing difference detector for detecting a difference between an output signal transmitted from the multiplier and an output signal transmitted from the cycle delay generator, and transmitting a signal indicative of the thus detected difference to the clock-delay compensator as the stop signal.

It is preferable that at least one of the first, second and cycle delay generators is comprised of a plurality of MOS transistors at least one of which is turned on when receiving an output signal transmitted from the clock cycle detector, the first period of time being comprised of a period of time in which the turned-on MOS transistor is charged.

It is preferable that at least one of the first, second and cycle delay generators is comprised of a plurality of switches one of which is turned on when receiving an output signal transmitted from the clock cycle detector, and a plurality of delay circuits, and wherein a clock signal input into the delay circuits is output from a delay circuit among the delay circuits, associated with the turned-on switch.

It is preferable that at least one of the first, second and cycle delay generators is comprised of a plurality of first delay circuits, a plurality of second delay circuits in which a clock signal is transmitted in a direction opposite to a direction in which a clock signal is transmitted in the first delay circuits, and a plurality of switches one of which is turned on when receiving an output signal transmitted from the clock cycle detector, a clock signal input thereinto being transmitted through the first delay circuits, being input into the second delay circuits from a first delay circuit among the first delay circuits, located in association with the turned-on switch, through the turned-on switch, and being transmitted through the second delay circuits toward an output port thereof.

There is further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector including (ba) a clock cycle detector for detecting a clock cycle of a first output clock signal transmitted from the input buffer, and (bb) a skew delay detector for skew delay in each of the input buffer and the clock driver, the skew delay detector including (bb1) a first timing difference detector for transmitting a clock signal having a pulse width indicative of a time difference defined as (td1+td2) wherein td1 indicates delay time of the input buffer and td2 indicates delay time of the clock driver, (bb2) a clock cycle detector dummy having the same delay time td3 as that of the clock cycle detector and receiving the first output clock signal, (bb3) a divider for dividing both the first output clock signal and an output clock signal transmitted from the clock cycle detector dummy to thereby transmit complementary clock signals each having a cycle of 2×T1 and a pulse width defined as (T1+td3), and each having a leading edge equal to that of the first output clock signal and a trailing edge delayed from that of the first output clock signal by td3, (bb4) first and second synthesizers for synthesizing the complementary clock signals and the clock signal transmitted from the first timing difference detector to thereby transmit output signals each having a cycle of 2×T1 and also having an active level period defined as (td1+td2+T1+td3), (bb5) a timing signal generator for generating a timing signal having a duty ratio of 50, (bb6) a delay generator including a plurality of switches one of which is turned on when receiving an output clock signal transmitted from the clock cycle detector, and a plurality of delay circuits, the delay generator receiving both an output clock signal transmitted from the timing signal generator and output clock signals transmitted from the first and second synthesizers, the output clock signal transmitted from the timing signal generator being controlled by the output clock signals transmitted from the first and second synthesizers as to advancing and stopping in the delay circuits, (bb7) a cycle delay generator including a plurality of switches one of which is turned on when receiving an output signal transmitted from the clock cycle detector, and a plurality of delay circuits, the cycle delay generator receiving the first output clock signal, which is looped at a position associated with the turned-on switch, and is transmitted in the delay circuits toward an output port, (bb9) a second timing difference detector for detecting a difference between an output signal transmitted from the delay generator and an output signal transmitted from the cycle delay generator, and transmitting a signal indicative of the thus detected difference to the clock-delay compensator as the stop signal.

There is further provided a circuit for controlling a clock signal, including (a) an input buffer through which an external clock signal is received, (b) a clock delay detector for detecting a first period of time defined as (T1−T2) wherein T1 is a cycle of the external clock signal, and T2 is a period of time during which the external clock signal is transmitted through devices generating skew to the external clock signal, and transmitting a stop signal by the first period of time, (c) a clock-delay compensator for receiving the stop signal from the clock delay detector and stopping the external clock signal to be transmitted by the first period of time, (d) a clock driver for driving an output signal transmitted from the clock-delay compensator to thereby turn the output signal into an internal clock signal, and (e) an input buffer dummy equivalent to the input buffer for receiving the internal clock signal, the clock delay detector including (ba) a clock cycle detector for detecting a clock cycle of a first output clock signal transmitted from the input buffer, and (bb) a skew delay detector for skew delay in each of the input buffer and the clock driver, the skew delay detector including (bb1) a first timing difference detector for transmitting a clock signal having a pulse width indicative of a time difference defined as (td1+td2) wherein td1 indicates delay time of the input buffer and td2 indicates delay time of the clock driver, (bb2) a divider for dividing the first output clock signal to thereby transmit complementary clock signals each having a cycle of 2×T1 and a pulse width defined as (T1+α) where α indicates a delay error inherent to a digital circuit, and each having a leading edge equal to that of the first output clock signal and a trailing edge delayed from that of the first output clock signal by (T1+α), (bb3) first and second synthesizers for synthesizing the complementary clock signals and the clock signal transmitted from the first timing difference detector to thereby transmit output signals each having a cycle of 2×T1 and also having an active level period defined as (td1+td2+T1+α), and (bb4) a cycle delay generator including a plurality of switches one of which is turned on when receiving the first output clock signal, and a plurality of delay circuits, the cycle delay generator receiving the first output clock signal, which is looped at a position associated with the turned-on switch, and is transmitted in the delay circuits toward an output port, the clock delay compensator including (c1) a timing signal generator for generating a timing signal having a duty ratio of 50, and (c2) a delay generator including a plurality of switches one of which is turned on when receiving an output clock signal transmitted from the clock cycle detector, and a plurality of delay circuits, the delay generator receiving both output clock signal transmitted from the timing signal generator and output clock signals transmitted from the first and second synthesizers, the output clock signal transmitted from the timing signal generator being controlled by the output clock signals transmitted from the first and second synthesizers as to advancing and stopping in the delay circuits.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 22C is a circuit diagram of an example of a second delay generating circuit.

DESCRIPTION OF THE PREFERRED EMBODIMENTS

Preferred embodiments in accordance with the present invention will be explained hereinbelow with reference to drawings. In brief, in a circuit in accordance with the embodiments explained hereinbelow, a clock signal is stopped to advance by a period of time defined as (tCK−tSKEW) wherein tCK indicates a cycle of a clock signal, and tSKEW indicates delay time of a circuit for amplifying a clock signal.

[First Embodiment]

Figure 10A:
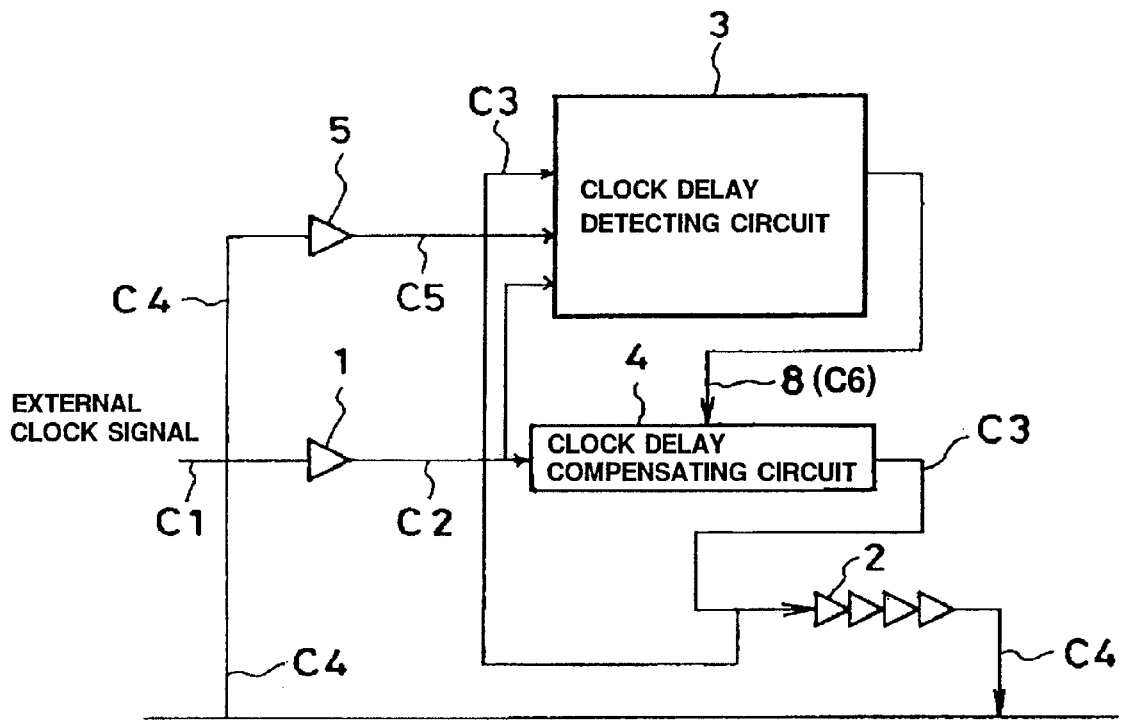
FIG. 10A is a circuit diagram of a circuit for controlling a clock signal, in accordance with the first embodiment of the invention.

FIG. 10A illustrates a circuit for controlling a clock signal, in accordance with the first embodiment. The illustrated circuit is comprised of an input buffer 1, a clock driver 2, a clock delay detecting circuit 3, a clock delay compensating circuit 4, and an input buffer dummy 5 having the same delay time as that of the input buffer 1.

An external clock signal C1 is input into the input buffer 1, and is amplified in the clock driver 2 to thereby be turned into an internal clock signal C4, which is to be transmitted to internal circuits (not illustrated). The clock delay detecting circuit 3 and the clock delay compensating circuit 4 cooperate with each other to thereby detect a time difference defined as (tCK−tSKEW) where tCK indicates a cycle of the external clock signal C1, and tSKEW indicates delay time of the input buffer 1 and the clock driver 2, and stop the external clock signal C1 to be transmitted from the input buffer 1 to the clock driver 2 by the thus detected time difference (tCK−tSKEW).

Specifically, the clock delay detecting circuit 3 receives an output signal C2 transmitted from the input buffer 1, an output signal C3 transmitted from the clock delay compensating circuit 4, and an output signal C5 transmitted from the input buffer dummy 5 receiving an output signal C4 transmitted from the clock driver 2, and detects delay time of the input buffer 1 and the clock driver 2, based on those received output signals C2, C3, and C5. The clock delay detecting circuit 3 transmits a stop signal 8 or C6 indicative of the thus detected delay time.

The clock delay compensating circuit 4 is positioned between an output of the input buffer 1 and an input of the clock driver 2, and stops the output clock signal C2 to be transmitted therein by clock skew having been detected in the clock delay detecting circuit 3, based on the stop signal 8 or C6 transmitted from the clock delay detecting circuit 3.

As mentioned later, the clock delay detecting circuit 3 is comprised of a row of delay circuits each having the same structure, and detects the delay time by virtue of a delay time difference in the row of delay circuits.

The external clock signal C1 is input into the input buffer 1 having delay time td1, and then, is transmitted as an output clock signal C2 into the clock delay compensating circuit 4. The clock signal C2 is made to stay in the clock delay compensating circuit 4 by the delay time defined as (tCK−tSKEW). Thereafter, the clock signal C2 is transmitted as an output clock signal C3 from the clock delay compensating circuit 4 into the clock driver 2 having delay time td2. An output clock signal C4 transmitted from the clock driver 2 is supplied to internal circuits (not illustrated) as an internal clock signal, as illustrated in FIG. 10B.

Figure 10B:
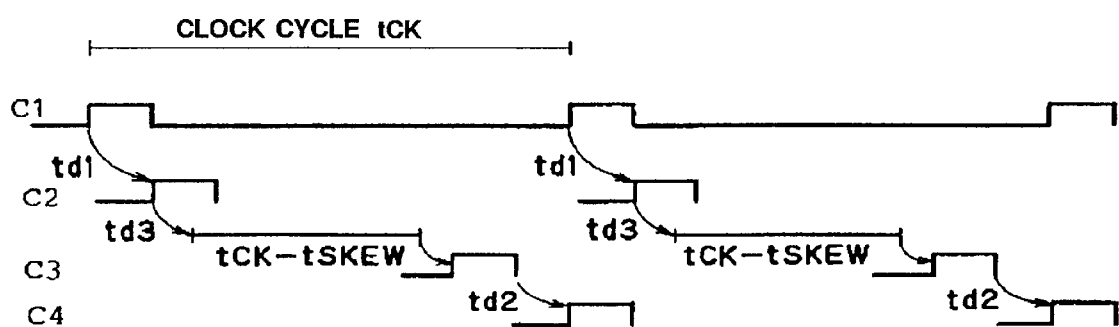
FIG. 10B is a timing chart of the circuit illustrated in FIG. 10A.

As illustrated in FIG. 10B, delay time td3 is generated from the time the output clock signal C2 is transmitted from the input buffer 1 until the output clock signal C3 is transmitted from the clock delay detecting circuit 3. Hence, as is obvious in view of FIG. 10B, a period of time from the time when the external clock signal C1 is input into the input buffer 1 until the output clock signal C4 leaves the clock driver 2, that is, a period of time from a leading edge of the external clock signal C1 to a leading edge of the internal clock signal C4, is just equal to the clock cycle tCK. This means that clock skew is apparently eliminated.

If the clock cycle tCK is smaller than the clock skew tSKEW, a period of time in which the clock signal is made to stay in the clock delay compensating circuit 4 is designed to be equal to (tCK−(tSKEW−N×tCK)) wherein N is an integer meeting with the equation tCK>(tSKEW−N×tCK).

In accordance with the above-mentioned embodiment, the delay time td2 of the clock driver 2 is eliminated. Hence, it is no longer necessary for the circuit in accordance with the embodiment to have a dummy delay circuit of the clock driver 2, and the circuit is readily applicable to a device, such as ASIC, which is difficult to estimate clock delay. Specifically, the circuit in accordance with the above-mentioned embodiment detects delay time and clock skew generated in elements through which a clock signal is transmitted until the clock signal is turned into the internal clock signal C4, such as the input buffer 1 and the clock driver 2, and compensates for the thus detected delay time and clock skew, to thereby render the internal clock signal C4 to have a cycle equal to the clock cycle tCK. Namely, clock skew is apparently eliminated. Thus, the circuit makes it no longer necessary to estimate delay time of the clock driver 2 and other elements, and compensate for the delay time.

In addition, since the delay time of the clock driver 2 is subtracted from the clock cycle tCK, the circuit properly operates, if the delay time of the clock driver 2 is varied due to variation in a temperature of elements constituting the circuit.

Furthermore, since the circuit in accordance with the above-mentioned embodiment detects delay time, based on a difference in delay time among a plurality of delay circuits having the same structure, there is not generated an error in delay time, which error would be found in a combination of a delay circuit for detecting delay time and a circuit for reproducing the thus detected delay time.

In the circuit in accordance with the above-mentioned embodiment, the delay time of a clock signal may be produced by driving load capacity by means of MOS transistors. This arrangement can reduce load and power consumption in comparison with a case where delay circuits are driven at a time.

[Second Embodiment]

Figure 11:
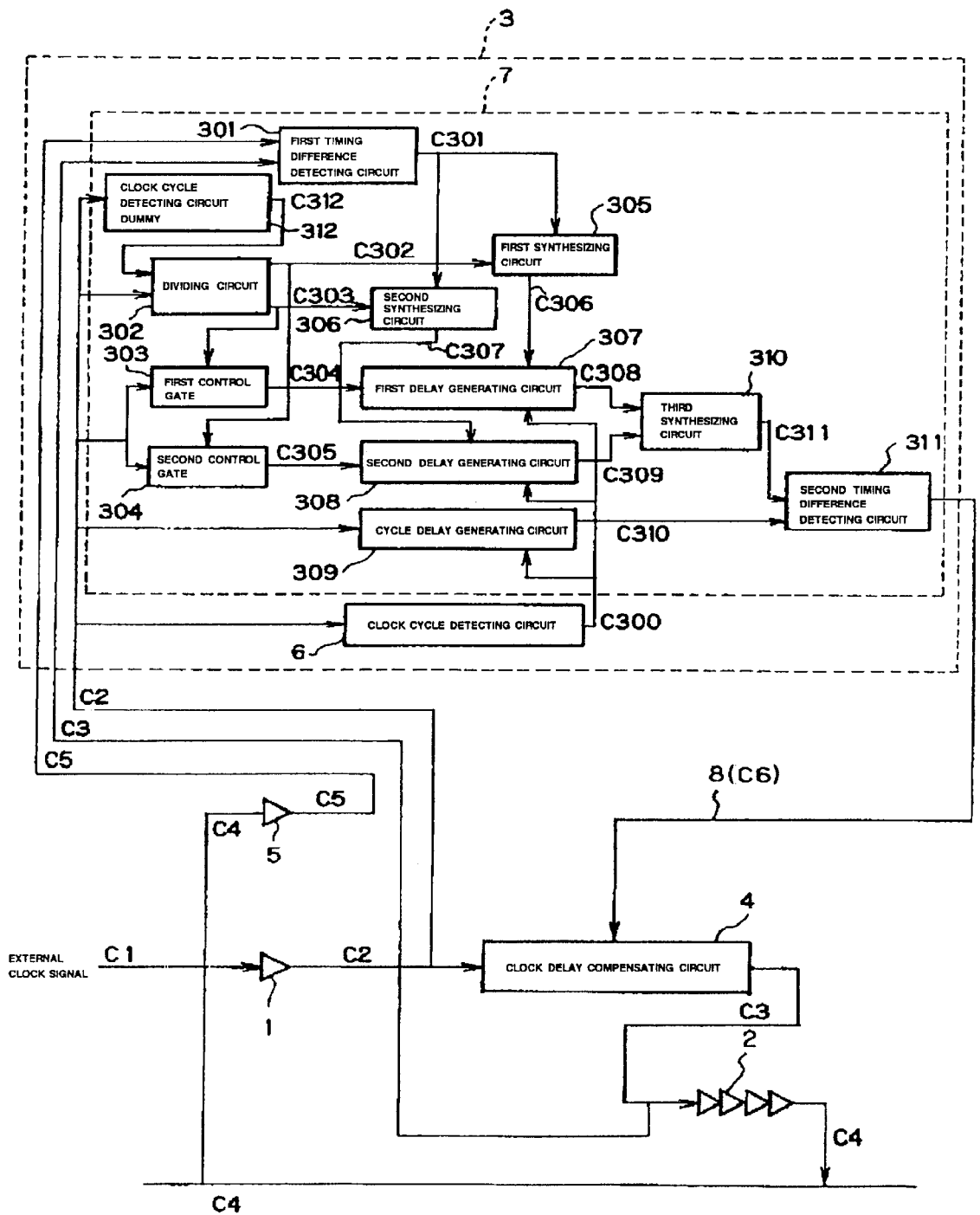
FIG. 11 is a circuit diagram of a circuit for controlling a clock signal, in accordance with the second embodiment of the invention.

FIG. 11 is a circuit diagram of a circuit for controlling a clock signal, in accordance with the second embodiment. The illustrated circuit is comprised of an input buffer 1, a clock driver 2, a clock delay detecting circuit 3, a clock delay compensating circuit 4, an input buffer dummy 5 having the same delay time as that of the input buffer 1, a clock cycle detecting circuit 6, and a skew delay detecting circuit 7.

An external clock signal C1 is input into the input buffer 1, and is amplified in the clock driver 2 to thereby be turned into an internal clock signal C4, which is to be transmitted to internal circuits (not illustrated). The clock delay detecting circuit 3 and the clock delay compensating circuit 4 cooperate with each other to thereby detect a time difference defined as (tCK−tSKEW) where tCK indicates a cycle of the external clock signal C1, and tSKEW indicates delay time of the input buffer 1 and the clock driver 2, and stop the external clock signal C1 to be transmitted from the input buffer 1 to the clock driver 2 by the thus detected time difference (tCK−tSKEW).

Figure 12:
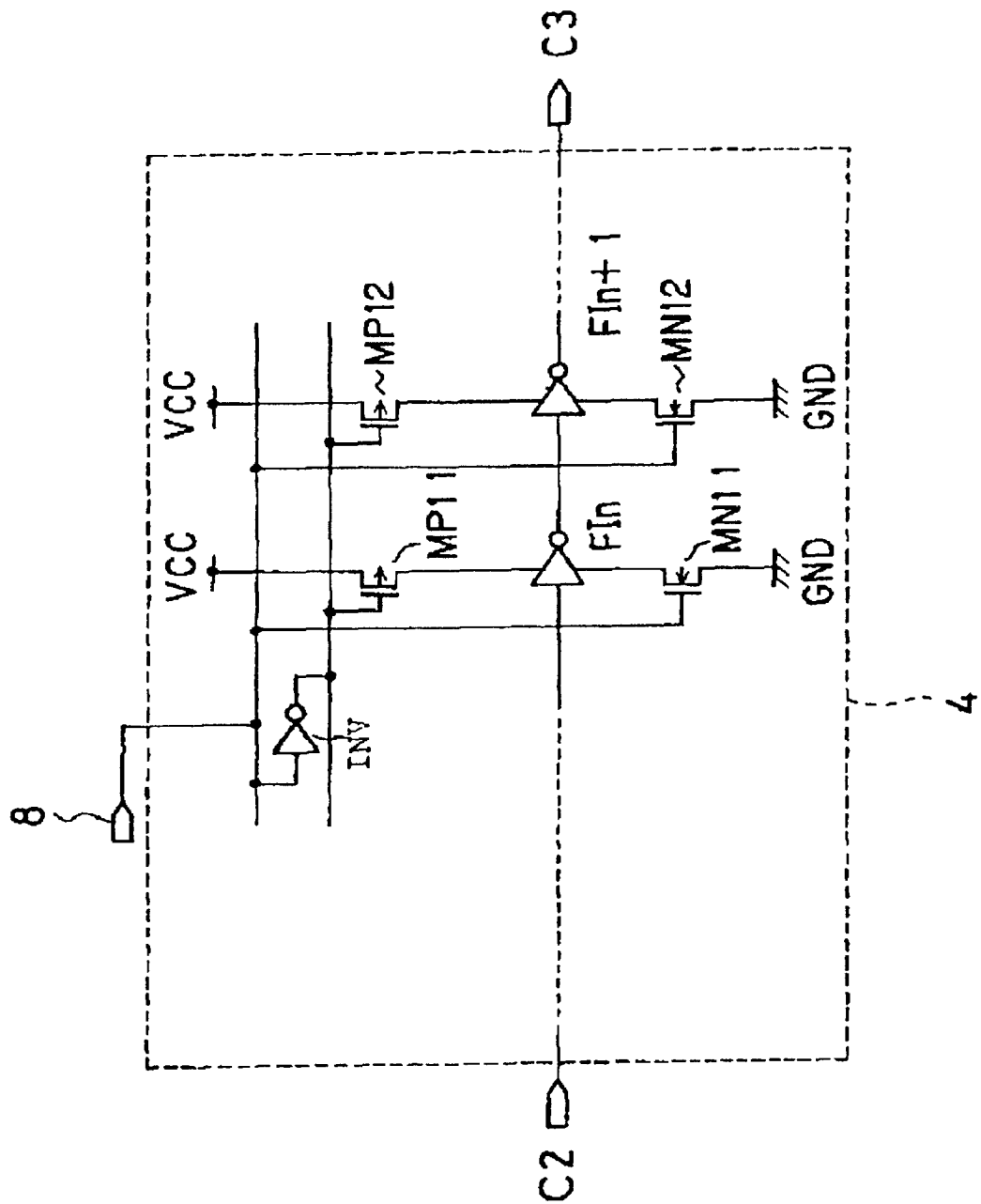
FIG. 12 is a circuit diagram of a clock delay compensating circuit as a part of the circuit illustrated in FIG. 11.

FIG. 12 is a circuit diagram of the clock delay compensating circuit 4 constituting a part of the circuit in accordance with the second embodiment. The clock delay compensating circuit 4 includes a plurality of clocked inverters connected to one another in cascade. In FIG. 12, only two clocked inverters are illustrated as having reference numbers $FI_n$, and $FI_{n+1}$. A plurality of p-channel MOS transistors MP11, MP12, - - -, are positioned between a power source VCC and the clocked inverters $FI_n$, $FI_{n+1}$, - - -, and a plurality of n-channel MOS transistors MN11, MN12, - - -, are positioned between the clocked inverters $FI_n$, $FI_{n+1}$, - - -, and the ground GND.

When the stop signal 8 is in the low level, the p-channel MOS transistors MP11, MP12, - - -, and the n-channel MOS transistors MN11, MN12, - - -, are turned on, resulting in that the clock signal C2 input into the clock delay compensating circuit 4 is transmitted through the clocked inverters $FI_n$, $FI_{n+1}$, - - -. On the other hand, when the stop signal 8 is in the low level, the p-channel MOS transistors MP11, MP12, - - -, and the n-channel MOS transistors MN11, MN12, - - -, are turned off, resulting in that the clocked inverters $FI_n$, $FI_{n+1}$, - - -, do not operate, and hence, the clock signal C2 is not transmitted through the clocked inverters $FI_n$, $FI_{n+1}$, - - -.

Referring back to FIG. 11, the skew delay detecting circuit 7 is comprised of first and second timing difference detecting circuits 301 and 311, a dividing circuit 302, first and second control gates 303 and 304, first, second, and third synthesizing circuits 305, 306, and 310, first and second delay generating circuits 307 and 308, a cycle delay generating circuit 309, and a clock cycle detecting circuit dummy 312.

Figure 13:
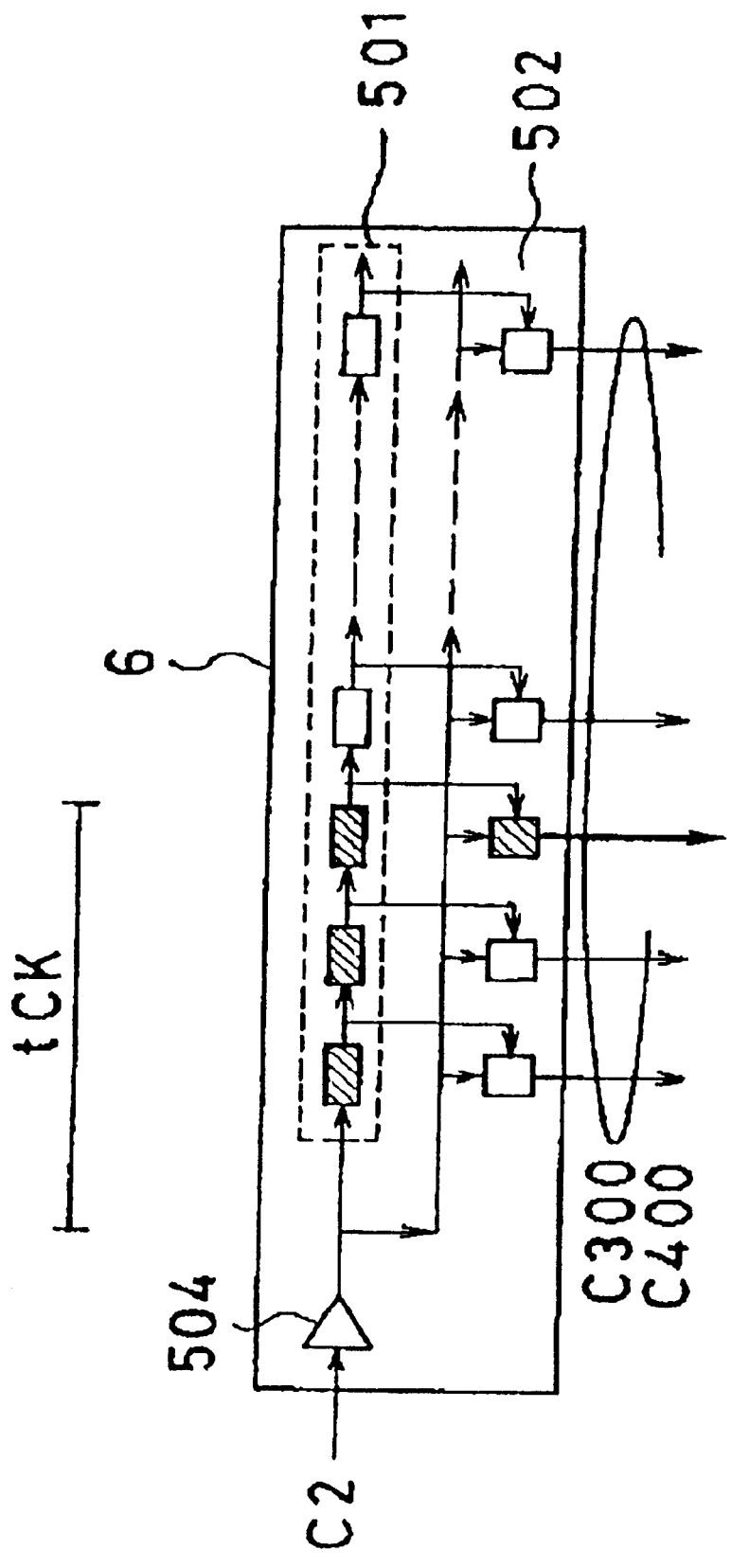
FIG. 13 is a circuit diagram of a clock cycle detecting circuit as a part of the circuit illustrated in FIG. 11.

FIG. 13 is a circuit diagram of an example of the clock cycle detecting circuit 6. As illustrated, the clock cycle detecting circuit 6 is comprised of a row of delay circuits 501 and a row of latch circuits 502. The clock signal C2 input into the clock cycle detecting circuit 6 advances through the row of delay circuits 501 by one cycle, namely, until the next clock signal is input into the clock cycle detecting circuit 6, and inverts an output signal transmitted from a latch circuit located in alignment with a delay circuit to which the clock signal C2 has advanced by one cycle. An output signal C300 transmitted from the row of latch circuits 502 is transmitted into internal circuits constituting the skew delay detecting circuit 7, such as the first and second delay generating circuits 307 and 308.

Figure 14:
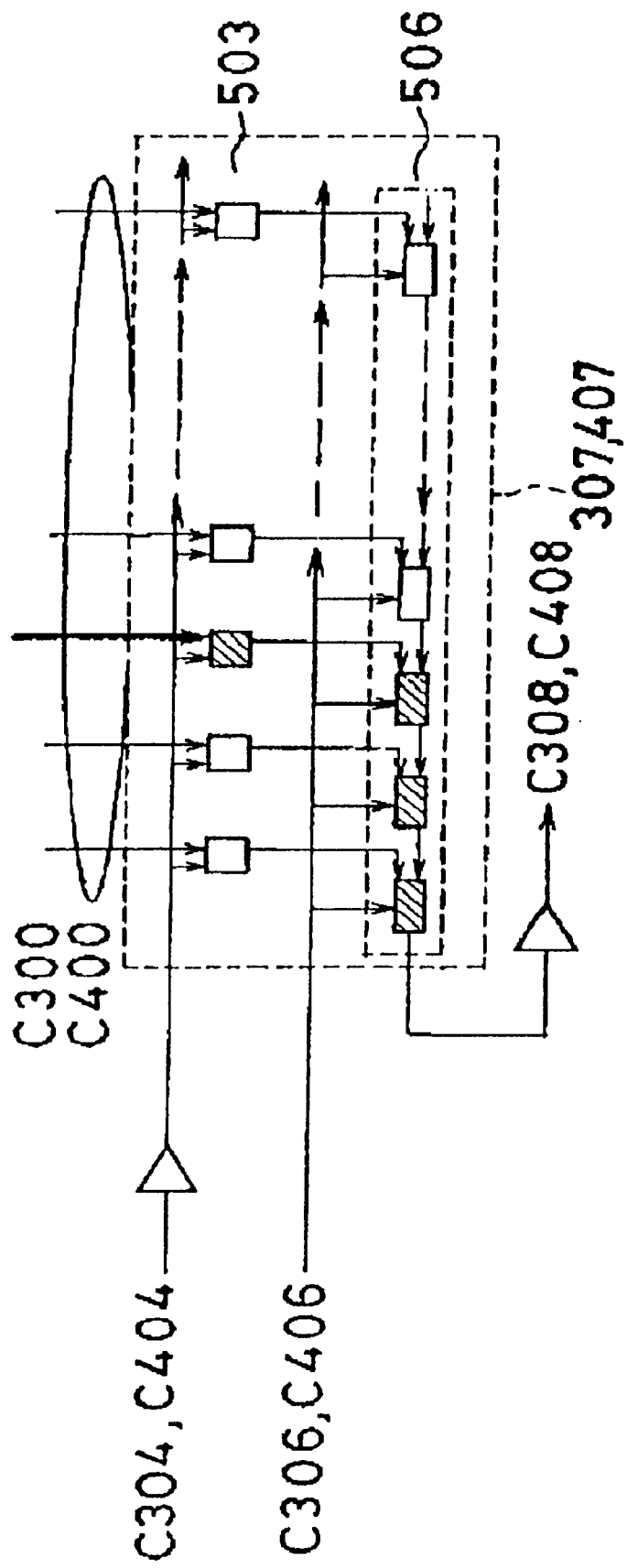
FIG. 14 is a circuit diagram of a first delay generating circuit as a part of the circuit illustrated in FIG. 11.
Figure 15:
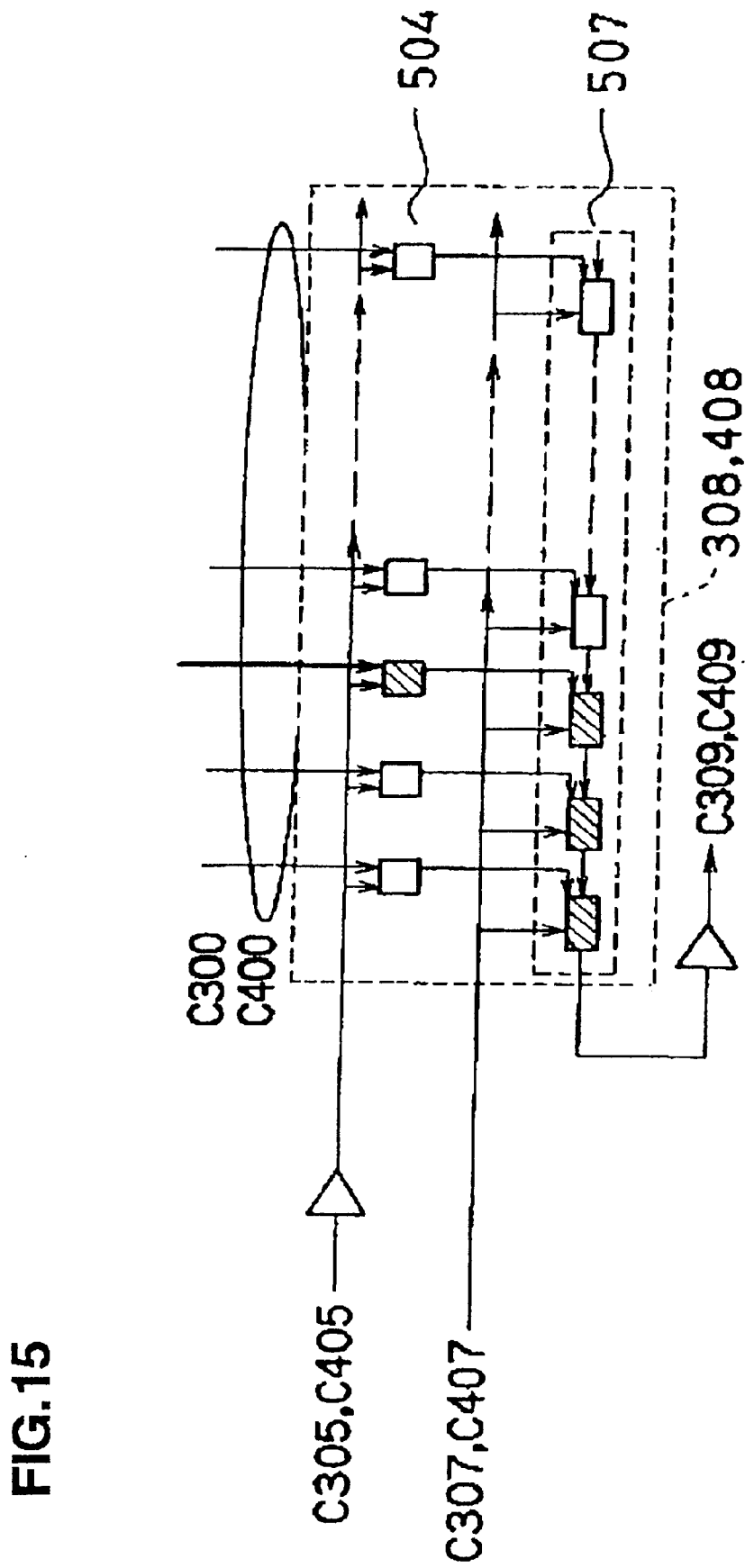
FIG. 15 is a circuit diagram of a second delay generating circuit as a part of the circuit illustrated in FIG. 11.
Figure 16:
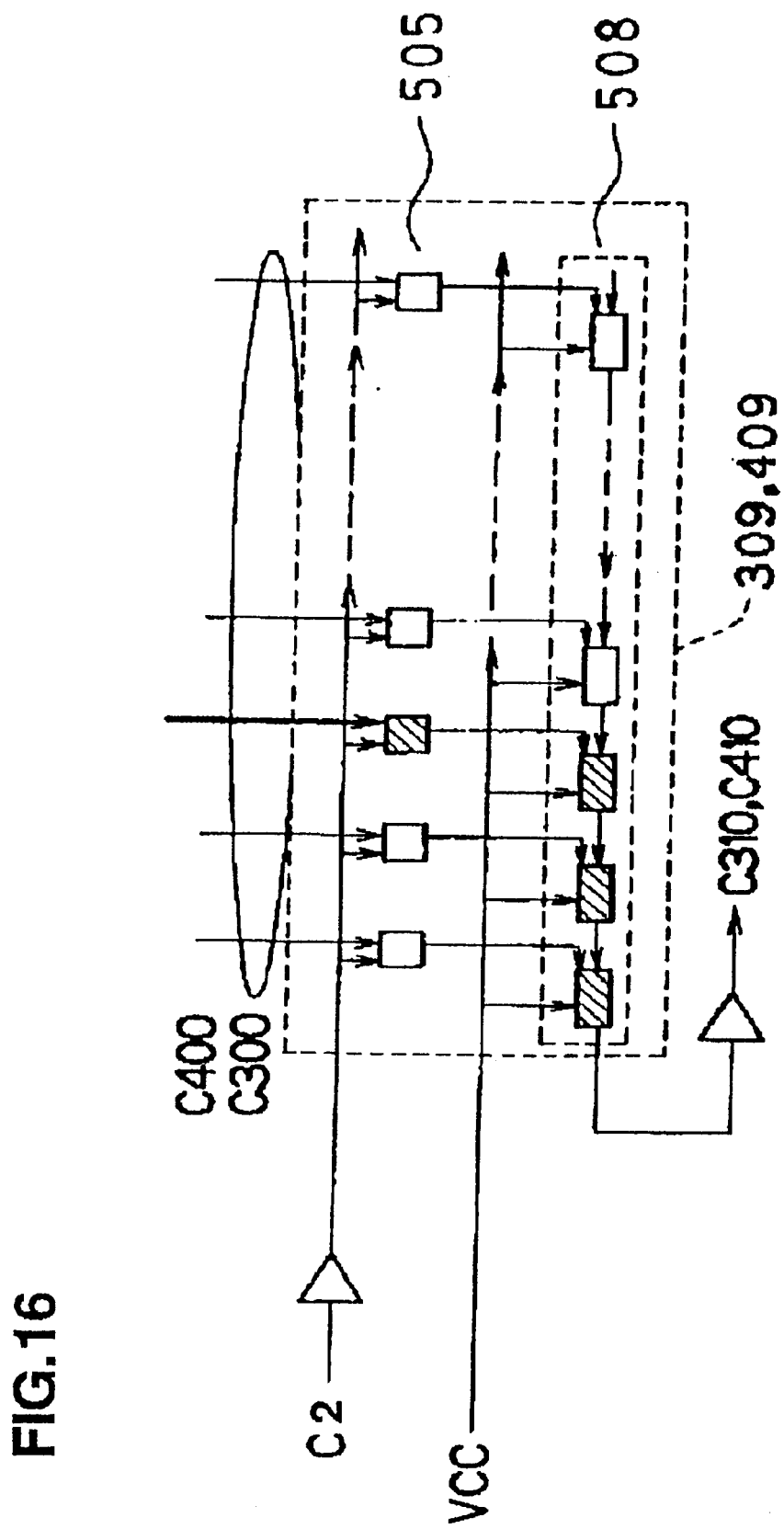
FIG. 16 is a circuit diagram of a cycle delay generating circuit as a part of the circuit illustrated in FIG. 11.

The first and second delay generating circuits 307 and 308, and the cycle delay generating circuit 309 are designed to have such a circuit structure as illustrated in FIGS. 14, 15, and 16, respectively. In each of them, a length of delay circuits is determined in accordance with the output signal C300 transmitted from the clock cycle detecting circuit 6.

In the second embodiment, the first delay generating circuit 307, the second delay generating circuit 308, and the cycle delay generating circuit 309 are designed to have the same structure. With reference to FIGS. 14 to 16, each of the first delay generating circuit 307, the second delay generating circuit 308, and the cycle delay generating circuit 309 is comprised of a row of switching circuits 503, 504, and 505, and a row of delay circuits 506, 507, and 508, respectively. The output signal C300 transmitted from the clock cycle detecting circuit 6 is input into each of the row of switching circuits 503, 504, and 505, and turns on one of switching circuits in each of the rows of switching circuits 503, 504, and 505.

In the first and second delay generating circuits 307 and 308, and the cycle delay generating circuit 309, one of switching circuits in each of the rows of switching circuits 503, 504, and 505 is turned on by the output signal C300 transmitted from the clock cycle detecting circuit 6. An input signal C304 transmitted into the first delay generating circuit 307, an input signal C305 transmitted into the second delay generating circuit 308, and the clock signal C2 transmitted into the cycle delay generating circuit 309 are input into delay circuits associated with the turned-on switching circuits, in the rows of delay circuits 506, 507 and 508, respectively, and then, looped to thereby be transmitted through the rows of delay circuits 506, 507 and 508. As a result, the input signals C304, C305, and C2 are transmitted from the rows of delay circuits 506, 507, and 508 as output signals C308, C309, and C310.

As a result of selecting a switching circuit to be turned on in the above-mentioned manner, the rows of delay circuits 506 and 507 of the first and second delay generating circuits 307 and 308 have delay time defined as (tCK+α) wherein tCK indicates a clock cycle and α indicates a delay error. The delay error α is inherent to a digital circuit, generated in every minimum circuit unit, and is smaller than delay time of the minimum circuit unit.

A clock signal advancing through the rows of delay circuits 506 and 507 of the first and second delay generating circuits 307 and 308 is controlled as to whether it goes on advancing or it stops in accordance with logic levels of clock signals C306 and C307 input into the rows of delay circuits 506 and 507.

Similarly to the rows of delay circuits 506 and 507, the row of delay circuits 508 of the cycle delay generating circuit 309 has delay time defined as (tCK+α) in accordance with which switching circuit is selected to be turned on.

However, unlike the rows of delay circuits 506 and 507, the row of delay circuits 508 of the cycle delay generating circuit 309 is electrically connected to a power source VCC, and hence, a clock signal advancing through the cycle delay generating circuit 309 is not controlled as to whether it goes on advancing or stops. Hence, a clock signal transmitted from a turned-on switching circuit in the row of switching circuits 505 into a delay circuit associated with the turned-on switching circuit is transmitted through the row of delay circuits 508, and output from the row of delay circuits 508.

Thus, the circuit in accordance with the second embodiment makes its operation. Each of the first and second delay generating circuits 307 and 308, and the cycle delay generating circuit 309 has delay time defined as (tCK+α). Each of the first and second delay generating circuits 307 and 308 generates delay time defined as (tCK−tSKEW+α), and further generates delay time defined as (tCK−tSKEW) having no delay error, by detecting a difference between the delay time (tCK−tSKEW) and an output signal transmitted a cycle later from the cycle delay generating circuit 309. The clock delay compensating circuit 4 stops transmission of a clock signal by the thus produced delay time (tCK−tSKEW). As a result, a clock signal would have the delay time defined as tSKEW+tCK−tSKEW=tCK. Thus, it is possible to eliminate delay time in a clock signal.

The circuit elements illustrated in FIG. 11, but not having been explained in detail could be understood by those skilled in the art based on an operation of the circuit explained hereinbelow, and hence, are not detailed.

Hereinbelow is explained an operation of the circuit in accordance with the second embodiment.

Figure 17:
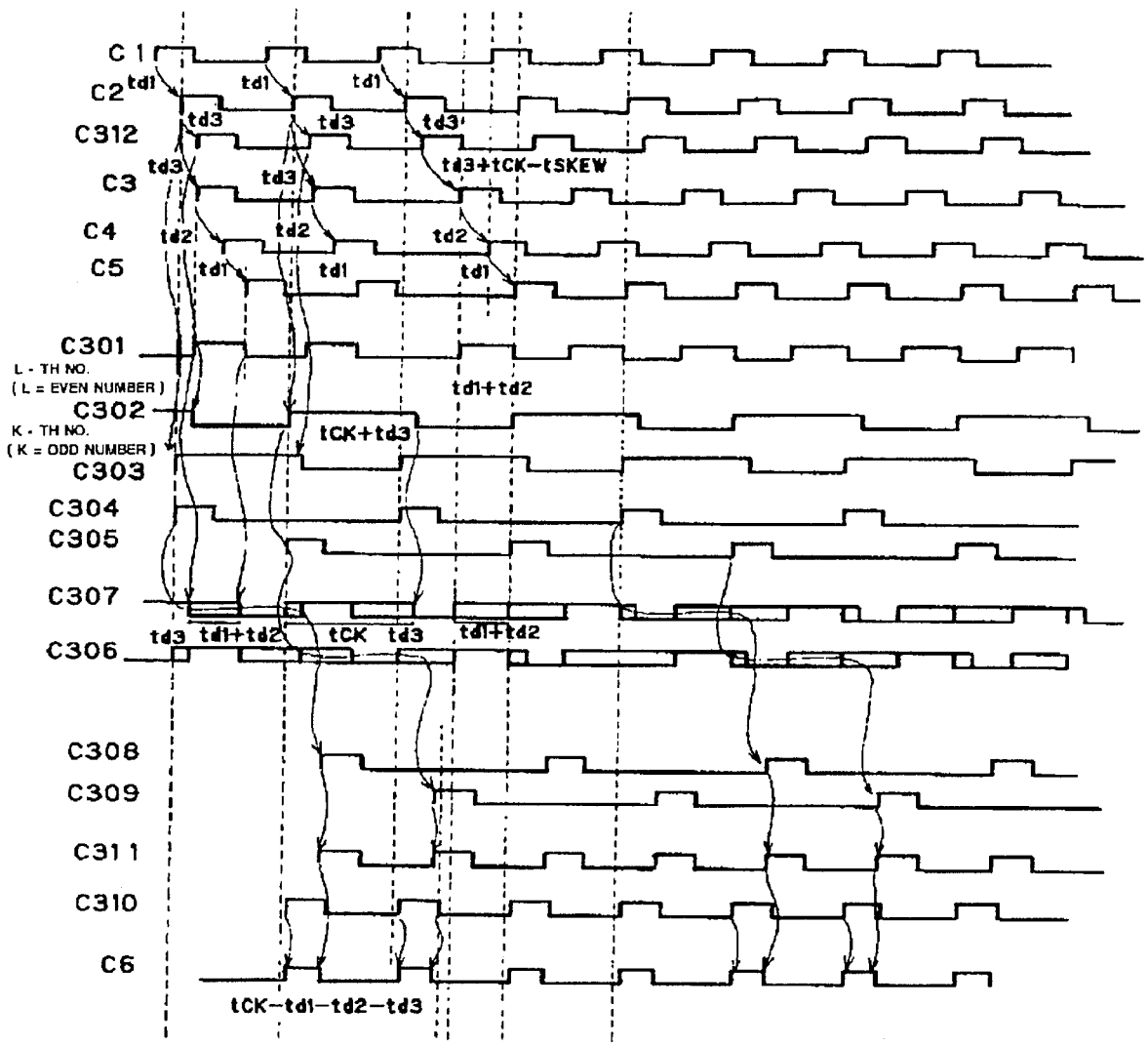
FIG. 17 is a timing chart of the circuit illustrated in FIG. 11.

With reference to FIGS. 11 and 17, the input buffer 1 receives the external clock C1 therein, and transmits the output clock signal C2. The output clock signal C2 is input into the clock delay compensating circuit 4, the clock cycle detecting circuit 6, the clock cycle detecting circuit dummy 312, the dividing circuit 302, the first and second control gates 303 and 304, and the cycle delay generating circuit 309.

The output clock signal C2 input into the clock delay compensating circuit 4 is output from the clock delay compensating circuit 4 as a clock signal C3. The clock signal C3 is input into both the clock driver 2 and the first timing difference detecting circuit 301.

The clock driver 2 receives the clock signal C3, and transmits the clock signal C4 as an internal clock signal, which is transmitted into internal circuits (not illustrated). The input buffer dummy 5 having the same delay time as that of the input buffer 1 receives the clock signal C4, and transmits a clock signal C5, which is input into the first timing difference detecting circuit 301. The first timing difference detecting circuit 301 transmits a clock signal C301 having a pulse width having a time difference (td2+td1) between the clock signals C5 and C3, wherein td1 indicates delay time of the input buffer 1 and hence the input buffer dummy 5, and td2 indicates delay time of the clock driver 2.

The clock cycle detecting circuit dummy 312 receives the clock signal C2, as mentioned earlier, and transmits a clock signal C312. Both the clock signals C2 and C312 are divided by the dividing circuit 302. As a result, the dividing circuit 302 transmits complementary clocks C302 and C303 each having a cycle of 2×tCK, and a pulse width defined as (tCK+td3). As illustrated in FIG. 17, each of the clock signals C302 and C303 has a leading edge equal to a leading edge of the clock signal C2, and a trailing edge delayed by td3 relative to a leading edge of the next clock signal C2.

The complementary clock signal C302 transmitted from the dividing circuit 302 and the clock signal C301 transmitted from the first timing difference detecting circuit 301 are synthesized in the first synthesizing circuit 305, and output from the first synthesizing circuit 305 as a clock signal C306. The complementary clock signal C303 transmitted from the dividing circuit 302 and the clock signal C301 transmitted from the first timing difference detecting circuit 301 are synthesized in the second synthesizing circuit 306, and output from the second synthesizing circuit 306 as a clock signal C307.

The clock signals C306 and C307 have a cycle defined as 2×tCK, and have a high level a duration of which is equal to a duration of a sum of two pulses, one having delay time (td1+td2) and the other (tCK+td3).

With respect to the high level duration of the clock signals C306 and C307, the clock signals C306 and C307 are in the high level during (td1+td2) and td3 in the first cycle, and are always in the high level in the second cycle.

As having been illustrated in FIGS. 14 and 15, a clock signal advancing through the rows of delay circuits 506 and 507 of the first and second delay generating circuits 307 and 308, respectively, is controlled by the clock signals C306 and C307 as to advancing or stopping thereof.

The first and second control gates 303 and 304 receive the clock signal C2, divide the clock signal C2 in accordance with the clock signals C302 and C303 transmitted from the dividing circuit 302, and transmit the clock signals C304 and C305. Both the clock signals C304 and C305 have a cycle of 2×tCK. The clock signals C304 and C305 advance through the rows of delay circuits 506 and 507 of the first and second delay generating circuits 307 and 308, respectively.

The clock signals C304 and C305 advance through the rows of delay circuits 506 and 507 while the clock signals C306 and 307 are in the high level.

As having been explained with reference to FIG. 14, the rows of delay circuits 506 and 507 of the first and second delay generating circuits 307 and 308 are designed to have delay time equal to about tCK.

A duration in which the clock signals C306 and C307 are in the high level is equal to (td1+td2)+td3+tCK, as mentioned earlier.

Hence, the clock signals C306 and C307 advance through the rows of delay circuits 506 and 507 of the first and second delay generating circuits 307 and 308, respectively, by a period of time (td1+td2+td3) in the first cycle.

The clock signals C306 and C307 advance through the rest of the rows of delay circuits 506 and 507 by a period of time (tCK−td3−td1−td2) in the second cycle. Then, the clock signals C306 and C307 are output from the rows of delay circuits 506 and 507 as clock signals C308 and C309, respectively. The clock signals C308 and C309 are synthesized in the third synthesizer 310, and transmitted from the third synthesizer 310 as a clock signal C311.

The clock signal C311 and the clock signal C310 transmitted from the cycle delay circuit 309 are input into the second timing difference detecting circuit 311, which in turn transmits the stop signal 8 or clock signal C6 having a cycle of tCK and a pulse width defined as (tCK−td3−td1−td2).

The reason why a difference between the clock signal C311 and the clock signal C310 is calculated in place of using the clock signal C311 as it is, is to remove digital errors in the rows of delay circuits 506 and 507 in the first and second delay generating circuits 307 and 308.

The clock delay compensating circuit 4 receives the thus produced stop signal 8 or clock signal C6, and stops a clock signal advancing therethrough by a period of time defined as (tCK−tSKEW) or (tCK−td3−td1−td2), wherein tSKEW= td1+td2+td3.

As a result, a period of time in which the external clock C1 advances through the input buffer 1, the clock delay compensating circuit 4, and the clock driver 2 is calculated as follows:

$$td1+td3+(tCK-td1-td2-td3)+td2=tCK.$$

Thus, the external clock signal C1 is equivalent in timing to the internal clock signal C4, which means that clock skew is substantially eliminated.

In the above-mentioned second embodiment, the clock driver 2 may transmit the internal clock signal C4 to a wiring formed on a board, in place of internal circuits, and may be synchronized with clock signals to be transmitted outside a chip.

The input buffer dummy 5 may be designed to have the same structure as that of the input buffer 1.

The circuit in accordance with the second embodiment may be used as a part of an integrated circuit, or a synchronization circuit of an external single chip.

[Third Embodiment]

Figure 18:
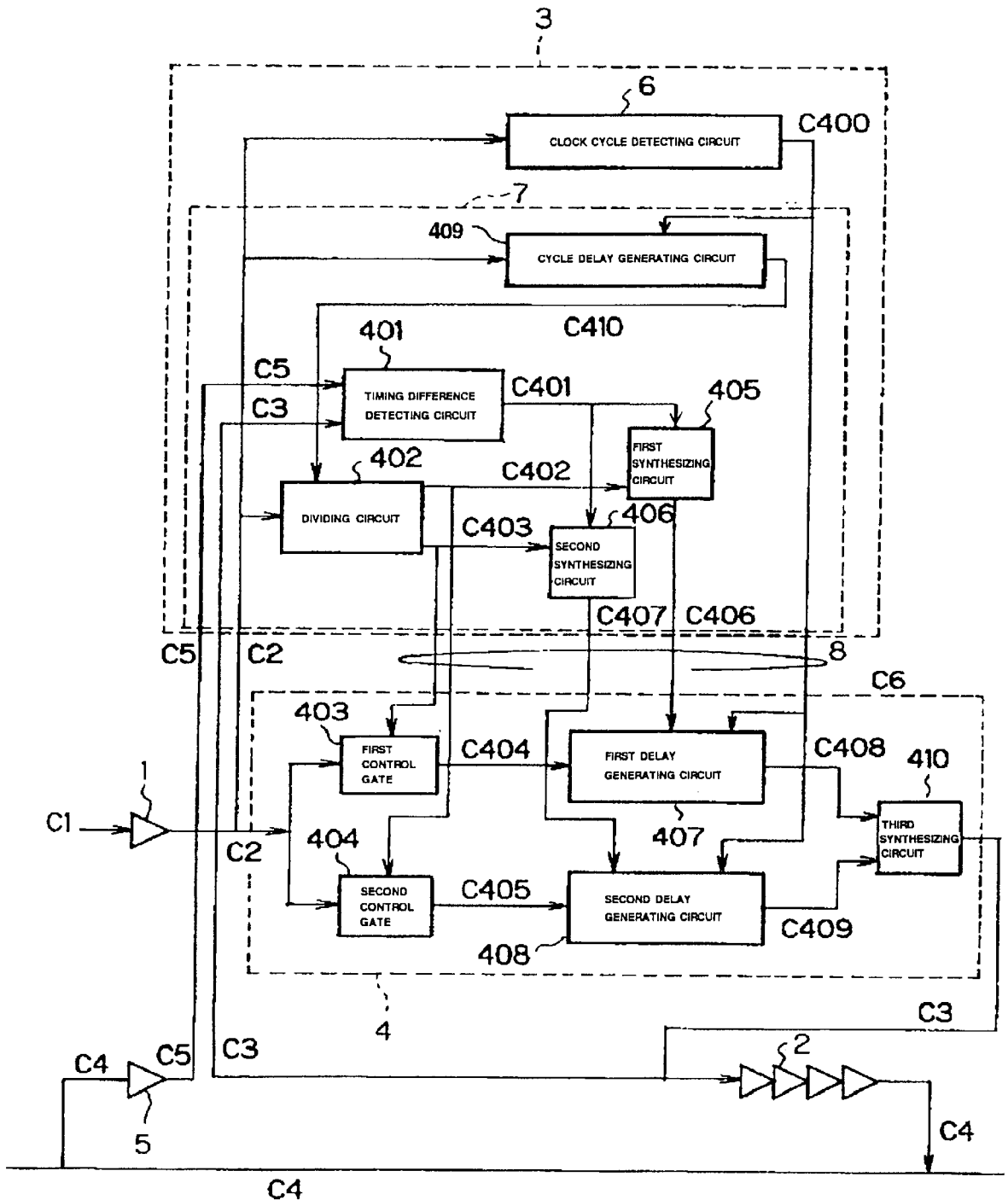
FIG. 18 is a circuit diagram of a circuit for controlling a clock signal, in accordance with the third embodiment of the invention.

FIG. 18 is a circuit diagram of a circuit for controlling a clock signal, in accordance with the third embodiment. The circuit in accordance with the third embodiment has the same structure as that of the circuit in accordance with the second embodiment except structures of the clock delay detecting circuit 3 and the clock delay compensating circuit 4.

In the circuit, the clock delay detecting circuit 3 is comprised of the clock cycle detecting circuit 6 and the skew delay detecting circuit 7. The skew delay detecting circuit 7 is comprised of a timing difference detecting circuit 401, a dividing circuit 402, first and second synthesizing circuits 405 and 406, and a cycle delay generating circuit 409.

The clock delay compensating circuit 4 is comprised of first and second control gates 403 and 404, first and second delay generating circuits 404 and 405, and a synthesizing circuit 410.

As illustrated in FIG. 13, the clock cycle detecting circuit 6 is comprised of a row of delay circuits 501 and a row of latch circuits 502. The clock signal C2 input into the clock cycle detecting circuit 6 advances through the row of delay circuits 501 by one cycle, namely, until the next clock signal is input into the clock cycle detecting circuit 6, and inverts an output signal transmitted from a latch circuit located in alignment with a delay circuit to which the clock signal C2 has advanced by one cycle. An output signal C300 transmitted from the row of latch circuits 502 is transmitted into internal circuits constituting the skew delay detecting circuit 7.

In each of the first and second delay generating circuits 407 and 408, and the cycle delay generating circuit 409, a length of delay circuits is determined in accordance with the output signal C400 transmitted from the clock cycle detecting circuit 6.

In the third embodiment, the first delay generating circuit 407, the second delay generating circuit 408, and the cycle delay generating circuit 409 are designed to have the same structure. With reference to FIGS. 14 to 16, each of the first delay generating circuit 407, the second delay generating circuit 408, and the cycle delay generating circuit 409 is comprised of a row of switching circuits 503, 504, and 505, and a row of delay circuits 506, 507, and 508, respectively. The output signal C400 transmitted from the clock cycle detecting circuit 6 is input into each of the row of switching circuits 503, 504, and 505, and turns on one of switching circuits in each of the rows of switching circuits 503, 504, and 505.

As a result of selecting a switching circuit to be turned on in the above-mentioned manner, the rows of delay circuits 506 and 507 of the first and second delay generating circuits 407 and 408 have delay time defined as $(tCK+\alpha)$ wherein tCK indicates a clock cycle and $\alpha$ indicates the above-mentioned delay error.

A clock signal advancing through the rows of delay circuits 506 and 507 of the first and second delay generating circuits 407 and 408 is controlled as to whether it goes on advancing or it stops in accordance with clock signals C406 and C407 input into the rows of delay circuits 506 and 507.

Similarly to the rows of delay circuits 506 and 507, the row of delay circuits 508 of the cycle delay generating circuit 409 has delay time defined as $(tCK+\alpha)$ in accordance with which switching circuit is selected to be turned on.

However, unlike the rows of delay circuits 506 and 507, the row of delay circuits 508 of the cycle delay generating circuit 409 is electrically connected to a power source VCC, and hence, a clock signal advancing through the cycle delay generating circuit 409 is not controlled as to whether it goes on advancing or stops.

Figure 19:
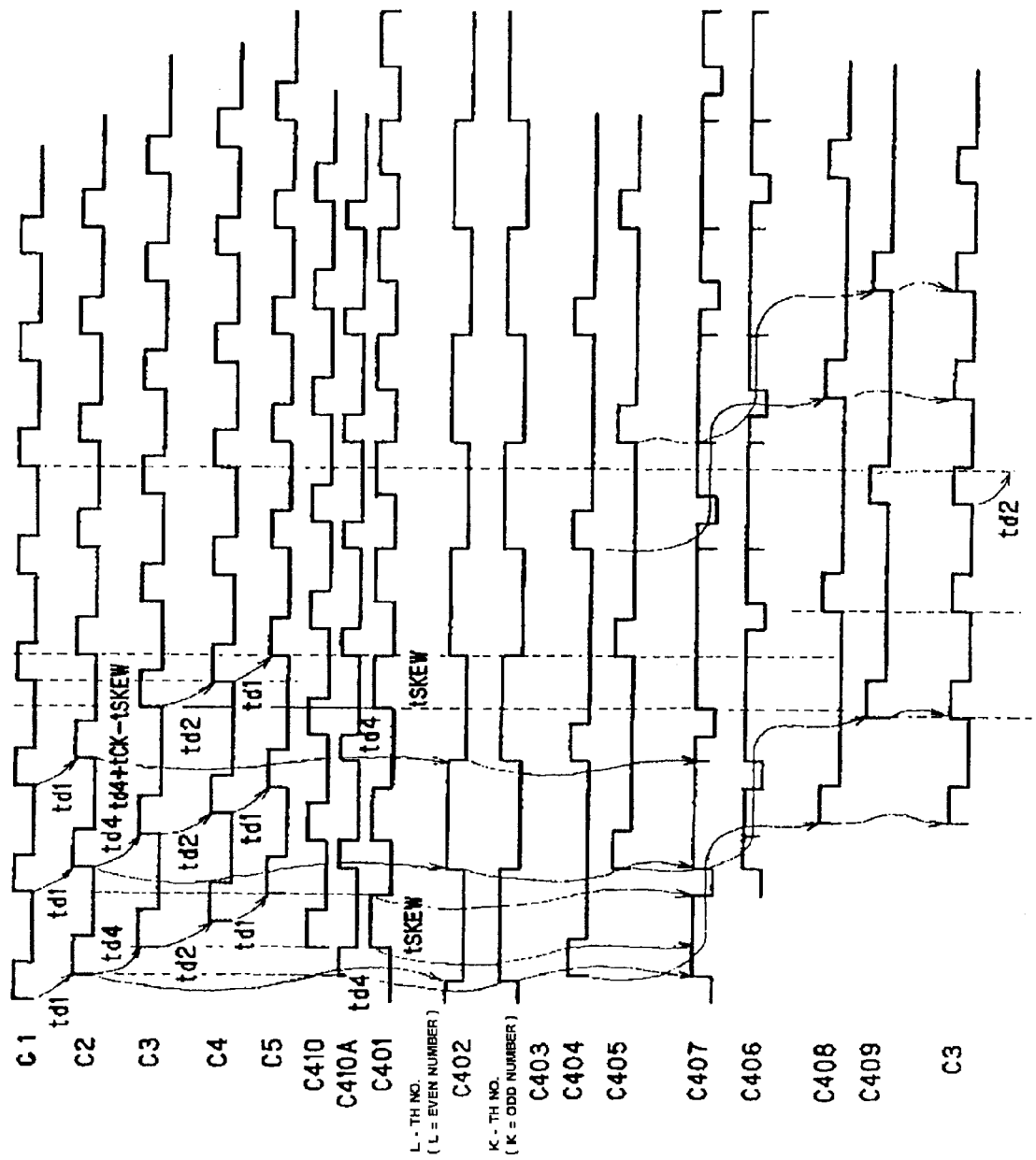
FIG. 19 is a timing chart of the circuit illustrated in FIG. 18.

Accordingly, the circuit in accordance with the third embodiment, illustrated in FIG. 18, operates in accordance with such timings as illustrated in FIG. 19.

First, the input buffer 1 receives the external clock C1 therein, and transmits the output clock signal C2. The output clock signal C2 is input into the first and second control gates 403 and 404, the clock cycle detecting circuit 6, the dividing circuit 402, and the cycle delay generating circuit 409.

The output clock signal C2 input into the clock delay compensating circuit 4 is output from the clock delay compensating circuit 4 as a clock signal C3. The clock signal C3 is input into both the clock driver 2 and the timing difference detecting circuit 401.

The clock driver 2 receives the clock signal C3, and transmits the clock signal C4 as an internal clock signal, which is transmitted into internal circuits (not illustrated). The input buffer dummy 5 having the same delay time as that of the input buffer 1 receives the clock signal C4, and transmits a clock signal C5, which is input into the timing difference detecting circuit 401. The timing difference detecting circuit 401 transmits a clock signal C401 having a pulse width having a time difference (td2+td1) between the clock signals C5 and C3, wherein td1 indicates delay time of the input buffer 1 and hence the input buffer dummy 5, and td2 indicates delay time of the clock driver 2.

The cycle delay generating circuit 409 receives the clock signal C2, as mentioned earlier, and transmits a clock signal C410. Both the clock signals C2 and C410 are divided by the dividing circuit 402. As a result, the dividing circuit 402 transmits complementary clocks C402 and C403 each having a cycle of 2×tCK, and a pulse width defined as $(tCK+\alpha)$. As illustrated in FIG. 19, each of the clock signals C402 and C403 has a leading edge equal to a leading edge of the clock signal C2, and a trailing edge delayed by $\alpha$ relative to a leading edge of the next clock signal C2.

The complementary clock signal C402 transmitted from the dividing circuit 402 and the clock signal C401 transmitted from the timing difference detecting circuit 401 are synthesized in the first synthesizing circuit 405, and are output from the first synthesizing circuit 405 as a clock signal C406. The complementary clock signal C403 transmitted from the dividing circuit 402 and the clock signal C401 transmitted from the timing difference detecting circuit 401 are synthesized in the second synthesizing circuit 406, and are output from the second synthesizing circuit 406 as a clock signal C407.

The clock signals C406 and C407 have a cycle defined as 2×tCK, and have a high level a duration of which is equal to a duration of a sum of two pulses, one having delay time (td1+td2) and the other $(tCK+\alpha)$.

With respect to the high level duration of the clock signals C406 and C407, the clock signals C406 and C407 are in the high level during (td1+td2) and $\alpha$ in the first cycle, and are always in the high level in the second cycle.

As having been illustrated in FIGS. 14 and 15, a clock signal advancing through the rows of delay circuits 506 and 507 of the first and second delay generating circuits 307 and 308, respectively, is controlled by the clock signals C406 and C407 as to advancing or stopping thereof.

The first and second control gates 303 and 304 receive the clock signal C2, divide the clock signal C2 in accordance with the clock signals C402 and C303 transmitted from the dividing circuit 402, and transmit the clock signals C404 and C405. Both the clock signals C404 and C405 have a cycle of 2×tCK. The clock signals C404 and C405 advance through the rows of delay circuits 506 and 507 of the first and second delay generating circuits 407 and 408, respectively.

The clock signals C404 and C405 advance through the rows of delay circuits 506 and 507 while the clock signals C406 and 407 are in the high level.

As having been explained with reference to FIG. 14, the rows of delay circuits 506 and 507 of the first and second delay generating circuits 407 and 408 are designed to have delay time defined as $(tCK+\alpha)$.

A duration in which the clock signals C406 and C407 are in the high level is equal to $(td1+td2)+\alpha+tCK$, as mentioned earlier.

Hence, the clock signals C406 and C407 advance through the rows of delay circuits 506 and 507 of the first and second delay generating circuits 407 and 408, respectively, by a period of time $(td1+td2+\alpha)$ in the first cycle.

The clock signals C406 and C407 advance through the rest of the rows of delay circuits 506 and 507 by a period of time $((tCK+\alpha)-td1-td2-\alpha)$ in the second cycle. Then, the clock signals C406 and C407 are output from the rows of delay circuits 506 and 507 as clock signals C408 and C409, respectively. The clock signals C408 and C409 are synthesized in the third synthesizer 410, and are transmitted from the third synthesizer 410 as a clock signal C3.

As a result, a period of time in which the external clock C1 advances through the input buffer 1, the clock delay compensating circuit 4, and the clock driver 2 is calculated as follows:

$$td1+(tCK+\alpha)-td1-td2-\alpha+td2=tCK.$$

Thus, the external clock signal C1 is equivalent in timing to the internal clock signal C4, which means that clock skew is substantially eliminated.

In accordance with the third embodiment, it is possible to reduce clock skew down to (td1+td2), which is smaller than clock skew in the second embodiment, ensuring a smaller minimum clock cycle than that of the second embodiment.

In the above-mentioned third embodiment, the first and second control gates 403 and 404 may be replaced with dividing circuits, and the third dividing circuit 410 may be replaced with a pulse generating circuit, which receives the clock signals C408 and C409, and transmits pulses.

As an alternative, the third dividing circuit 410 may be replaced with a circuit for transmitting signals having a duty ratio of 50.

In the above-mentioned second and third embodiments, since detection of clock skew is carried out for every 2×tCK, the circuits in accordance with the embodiments are designed to include the two delay generating circuits 307, 308 and 407, 408, which are alternately operated.

However, the circuit may be designed to include only one delay generating circuit. That is, as illustrated in FIG. 20, the clock delay compensating circuit 4 may be designed to include a control gate 503, a delay generating circuit 504, and a circuit 505 for multiplying an output signal transmitted from the delay generating circuit 504, by a certain number.

Figure 21:
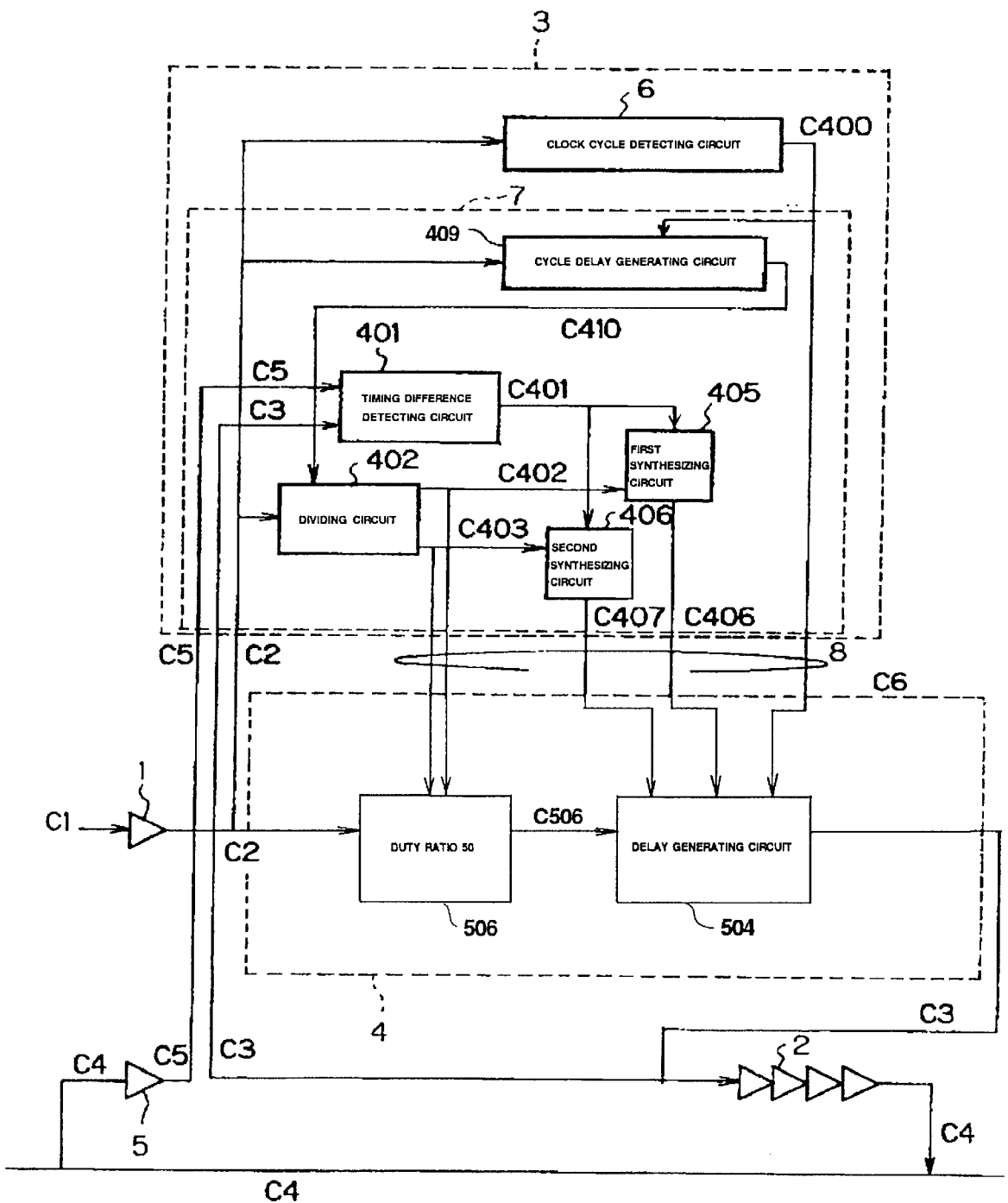
FIG. 21 is a circuit diagram of another variation of the circuit illustrated in FIG. 18.

As an alternative, the first and second control gates 403 and 404 may be replaced with a circuit 506 for generating signals having a duty ratio of 50, as illustrated in FIG. 21. The clock delay compensating circuit 4 in the circuit illustrated in FIG. 21 is comprised of the circuit 506 for generating signals having a duty ratio of 50, and a delay generating circuit 504.

Figure 20:
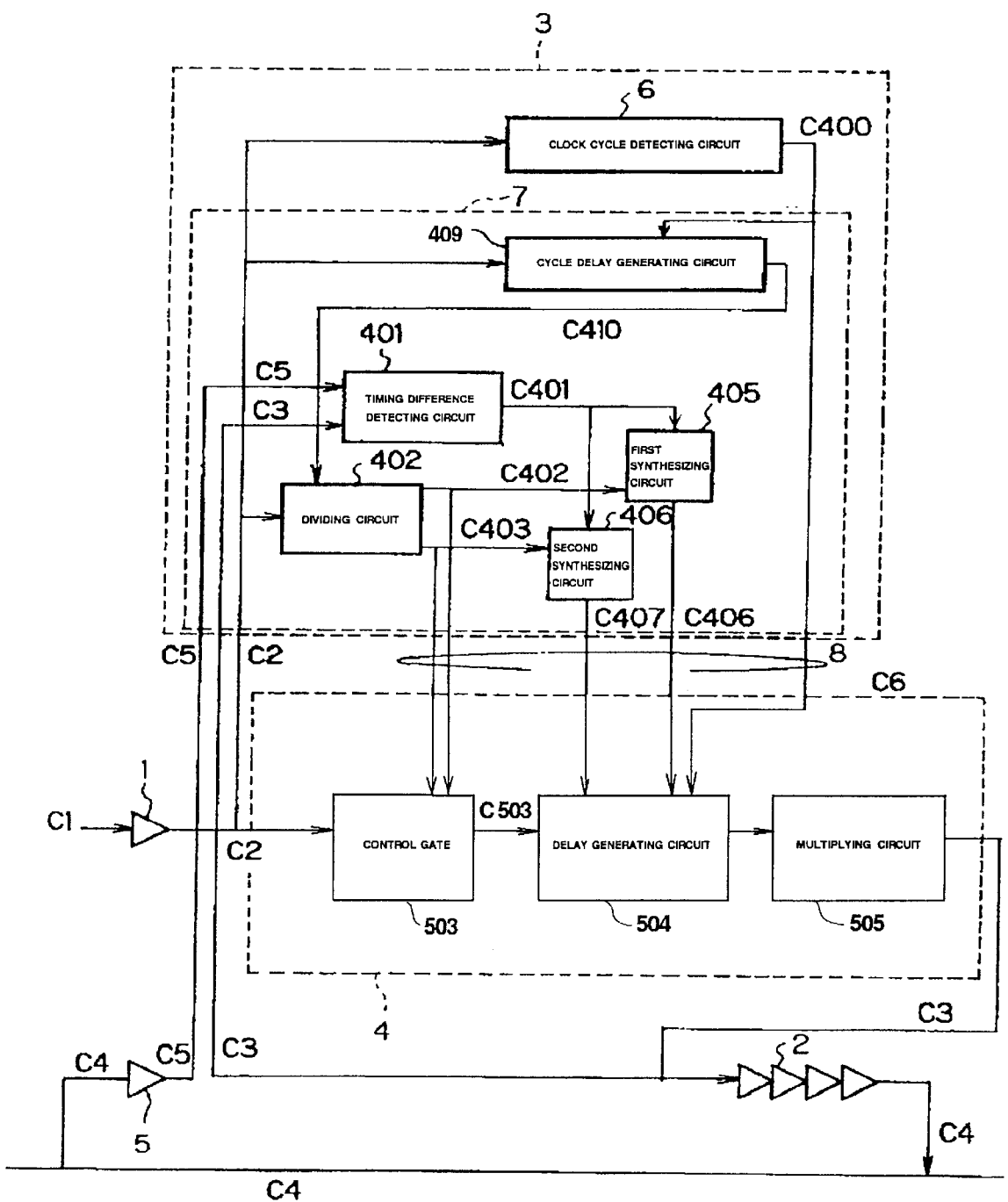
FIG. 20 is a circuit diagram of a variation of the circuit illustrated in FIG. 18.

The circuits illustrated in FIGS. 20 and 21 eliminate clock skew by means of a single circuit, whereas the circuits illustrated in FIGS. 11 and 18 eliminate clock skew by means of two circuits.

[Fourth Embodiment]

In the above-mentioned second and third embodiments, delay time almost equal to a cycle of a clock signal detected by the clock cycle detecting circuit 6 is reproduced by means of the delay generating circuits 307, 308, 407, and 408, and the cycle delay generating circuit 309 and 409. Specifically, an input terminal in one of delay circuits in the rows of delay circuits 506, 507, and 508 is selected through the use of the rows of switching circuits 503, 504, and 505. The delay time can be reproduced also by selecting an output terminal in one of delay circuits in the rows of delay circuits 506, 507, and 508, as mentioned below.

FIGS. 22A to 22D illustrate a clock cycle detecting circuit, first and second delay generating circuits, and a cycle delay generating circuit, respectively, in the circuit in accordance with the fourth embodiment. In this embodiment, as mentioned earlier, an output terminal in one of delay circuits is selected.

Figure 22A:
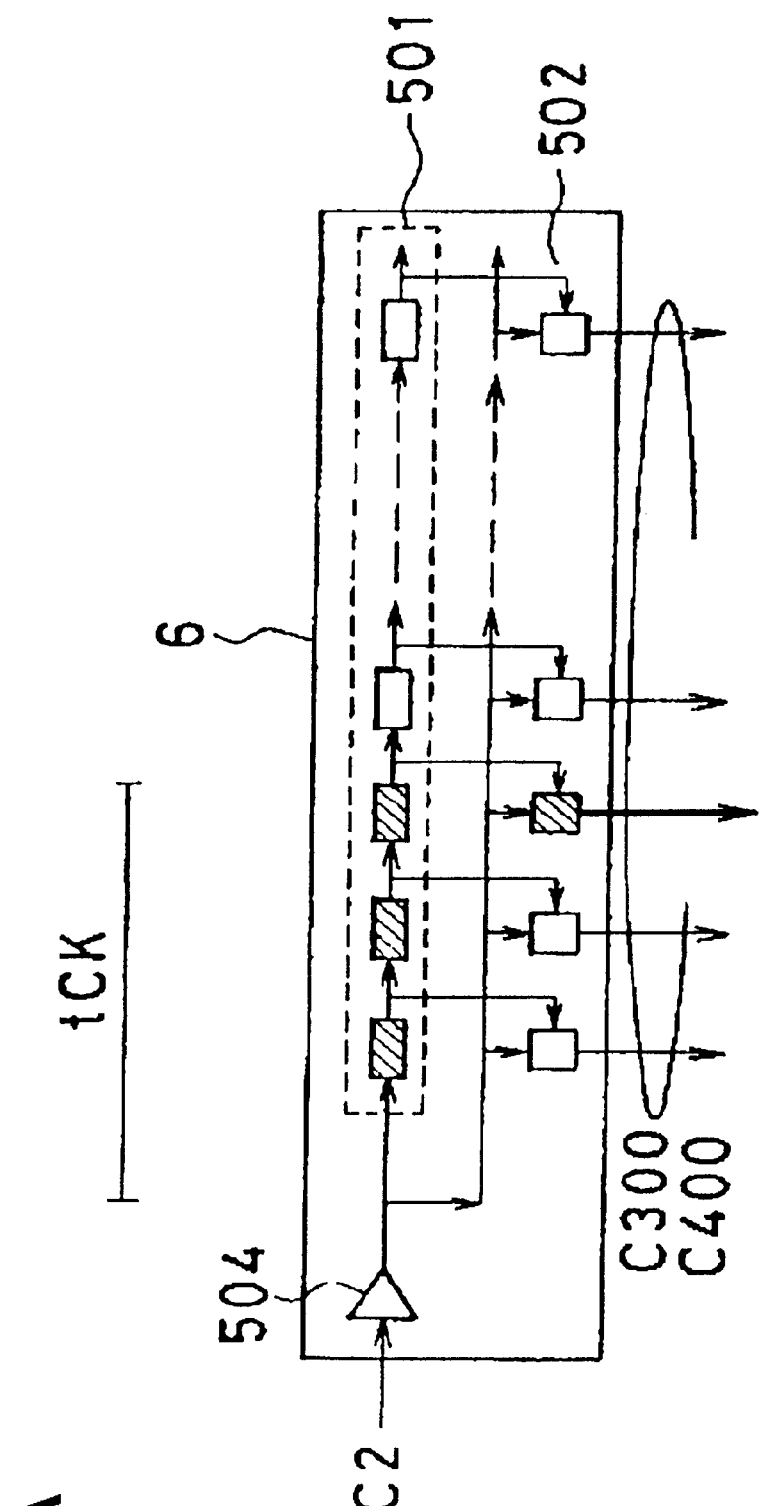
FIG. 22A is a circuit diagram of an example of a clock cycle detecting circuit.
Figure 22B:
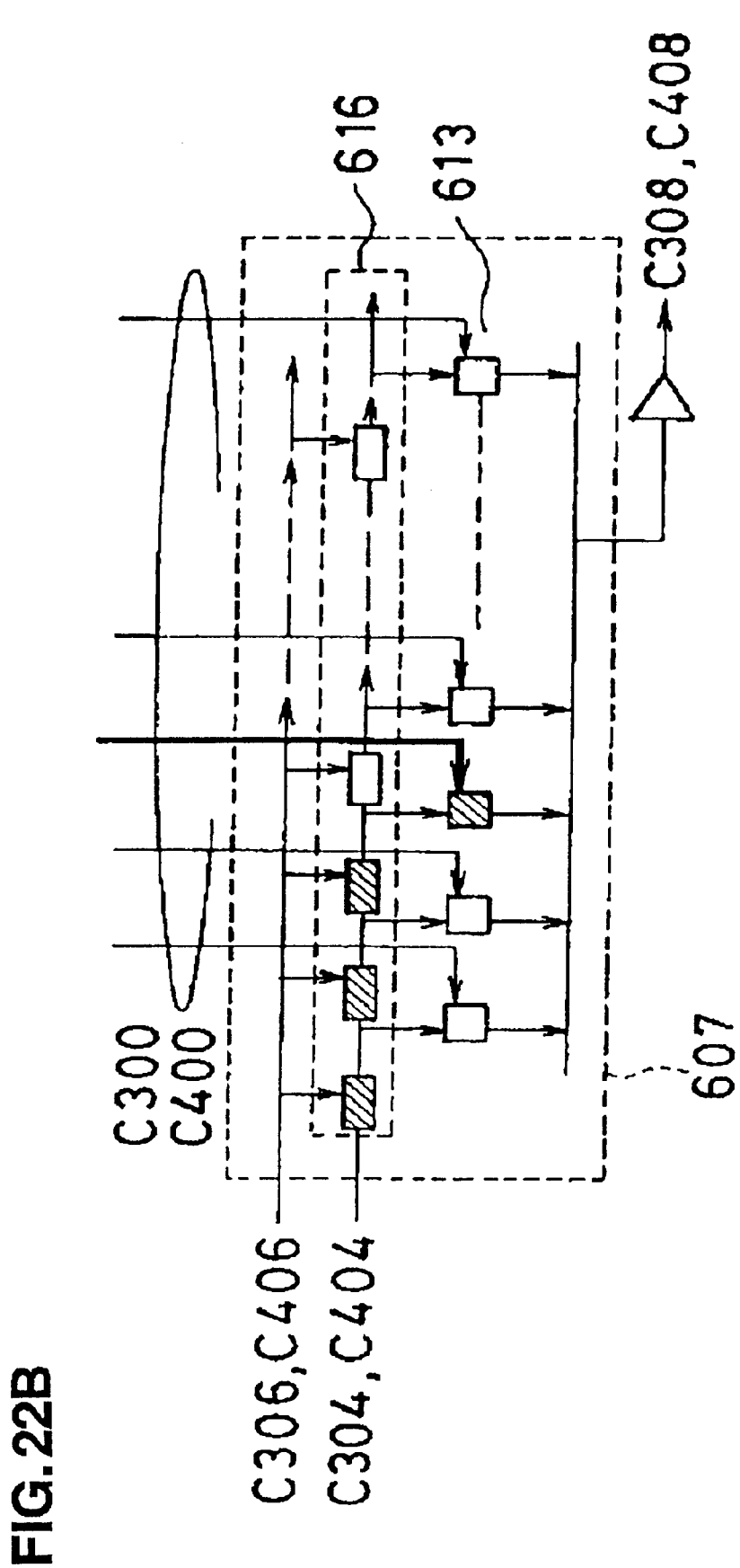
FIG. 22B is a circuit diagram of an example of a first delay generating circuit.
Figure 22D:
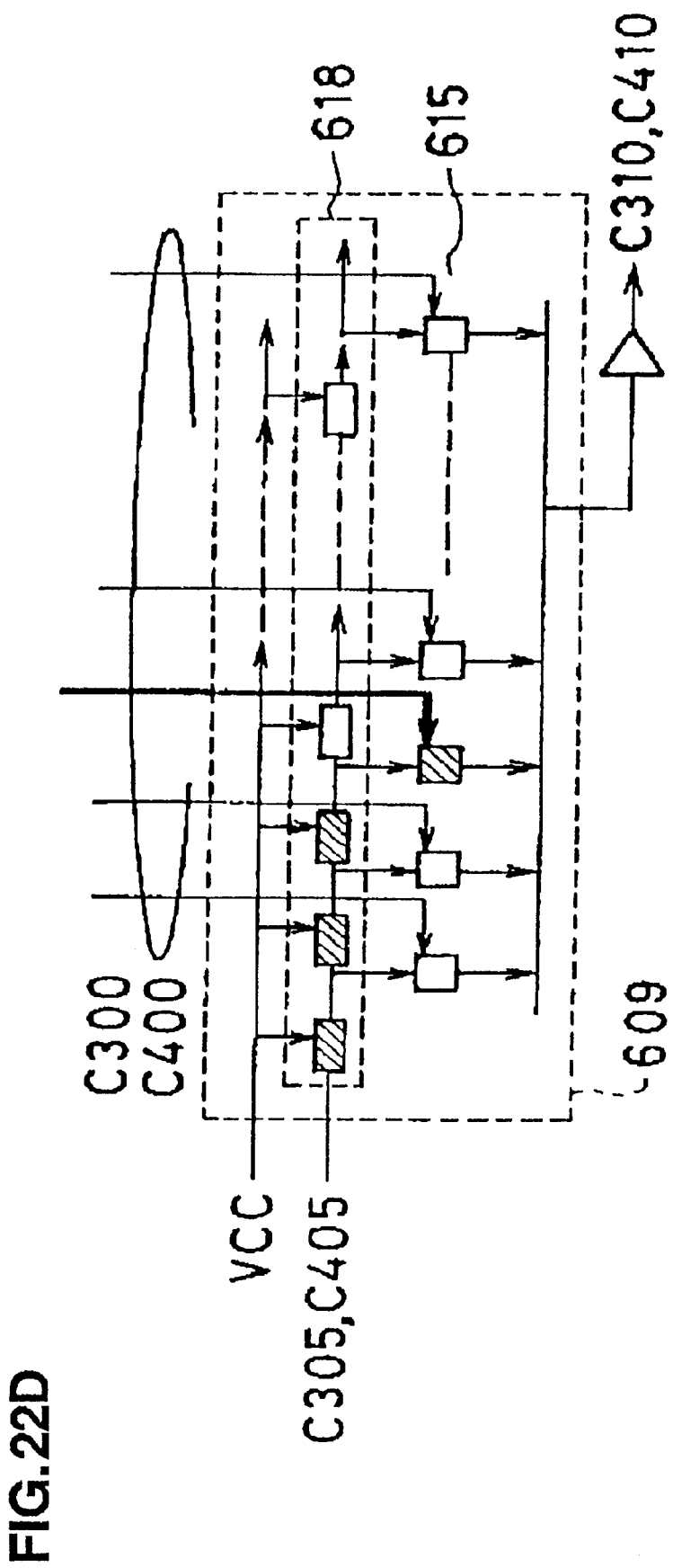
FIG. 22D is a circuit diagram of an example of a cycle delay generating circuit.

In the fourth embodiment, a first delay generating circuit 607, a second delay generating circuit 608, and a cycle delay generating circuit 609 are designed to have the same structure. With reference to FIGS. 22B to 22D, each of the first delay generating circuit 607, the second delay generating circuit 608, and the cycle delay generating circuit 609 is comprised of a row of switching circuits 613, 614, and 615, and a row of delay circuits 616, 617, and 618, respectively.

In accordance with the fourth embodiment, an output terminal in one of delay circuits in each of the rows of delay circuits 616, 617, and 618 is selected through each of the rows of switching circuits 613, 614, and 615.

The fourth embodiment makes it possible to reproduce delay time almost equal to a cycle of a clock signal, detected by the clock cycle detecting circuit 6.

[Fifth Embodiment]

In the above-mentioned second to fourth embodiments, delay time almost equal to a cycle of a clock signal detected by the clock cycle detecting circuit 6 is reproduced by means of the delay generating circuits 307, 308, 407, 408, 607, and 608, and the cycle delay generating circuit 309, 409 and 609. Specifically, an input terminal in one of delay circuits in the rows of delay circuits 506, 507, 508, 616, 617, and 618 is selected through the use of the rows of switching circuits 503, 504, 505, 613, 614, and 615. The delay time can be reproduced also by selecting a loop point in the rows of delay circuits 506, 507, 508, 616, 617, and 618 as mentioned below.

FIGS. 23A to 23D illustrate a clock cycle detecting circuit, first and second delay generating circuits, and a cycle delay generating circuit, respectively, in the circuit in accordance with the fifth embodiment. In this embodiment, as mentioned earlier, a loop or return point in the rows of delay circuits 506, 507, 508, 616, 617, and 618 is selected.

Figure 23A:
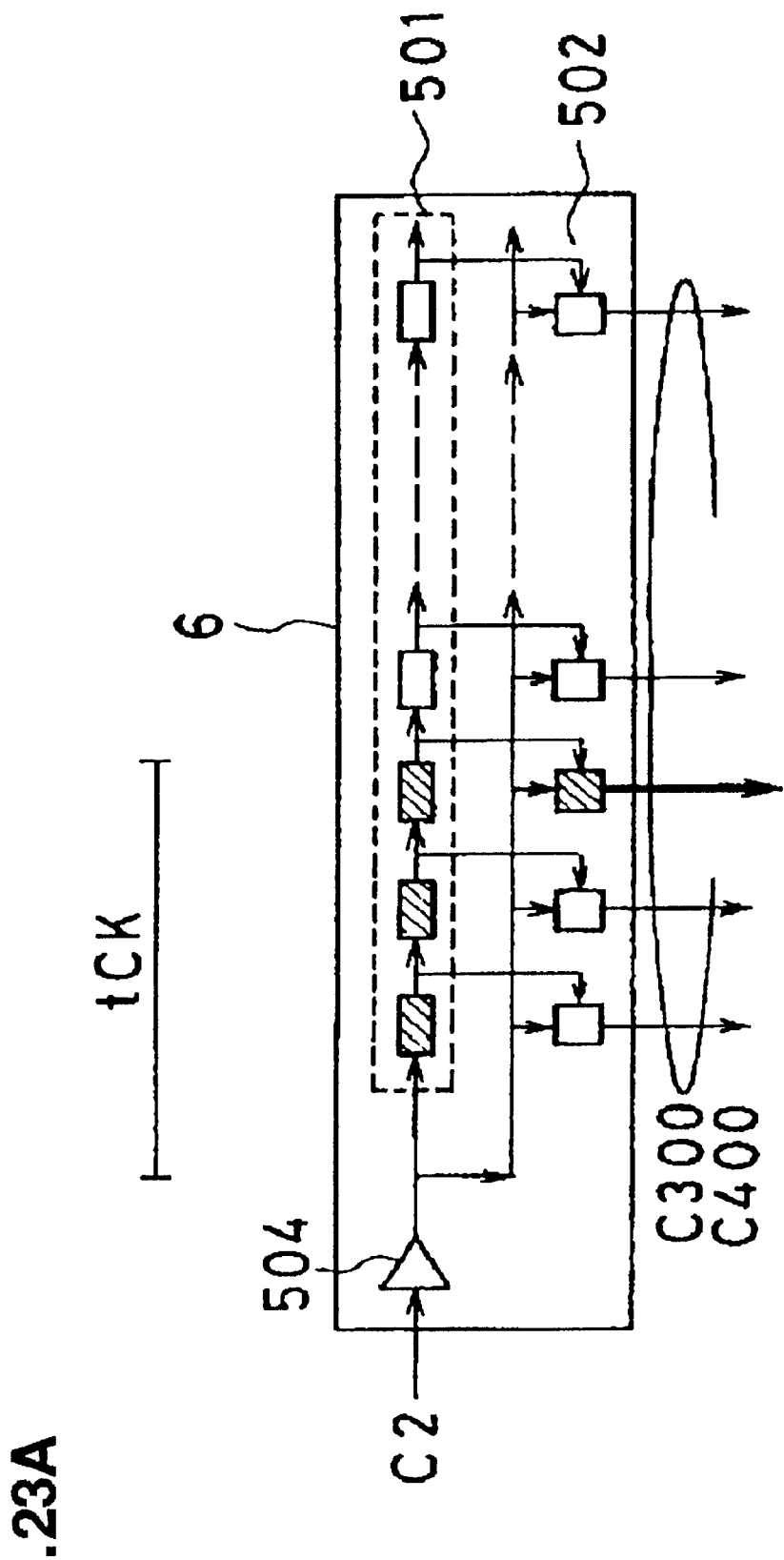
FIG. 23A is a circuit diagram of another example of a clock cycle detecting circuit.
Figure 23B:
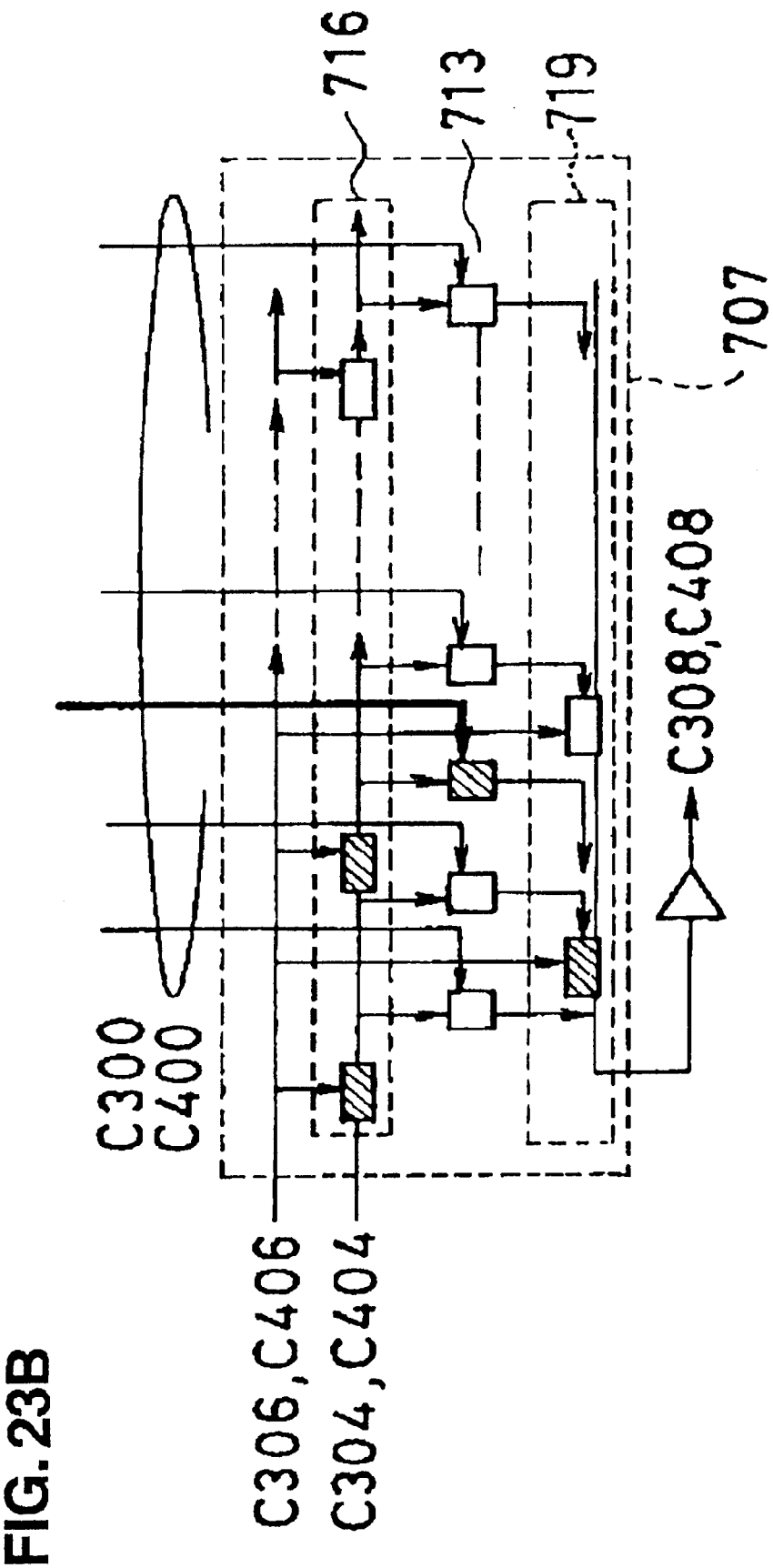
FIG. 23B is a circuit diagram of another example of a first delay generating circuit.
Figure 23C:
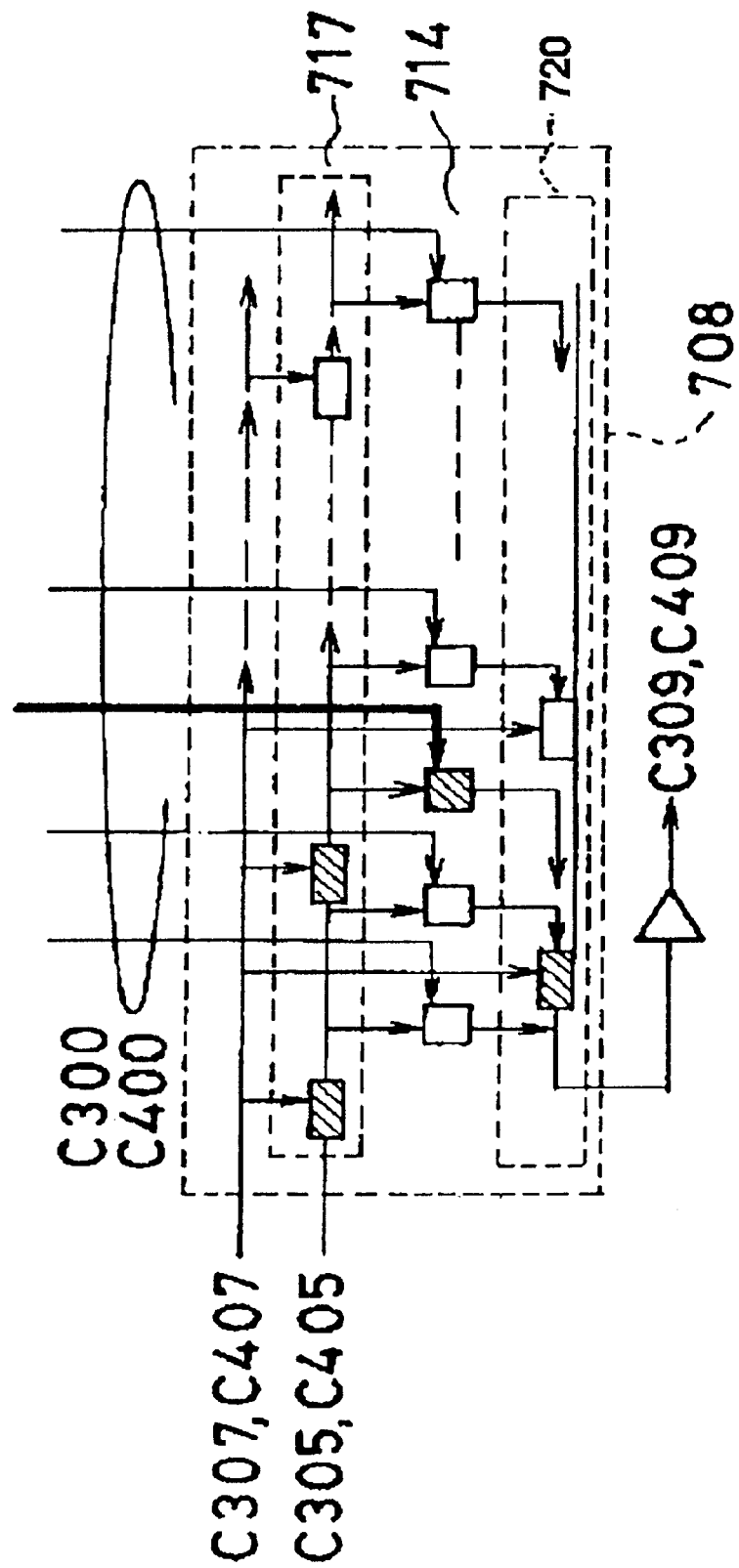
FIG. 23C is a circuit diagram of another example of a second delay generating circuit.
Figure 23D:
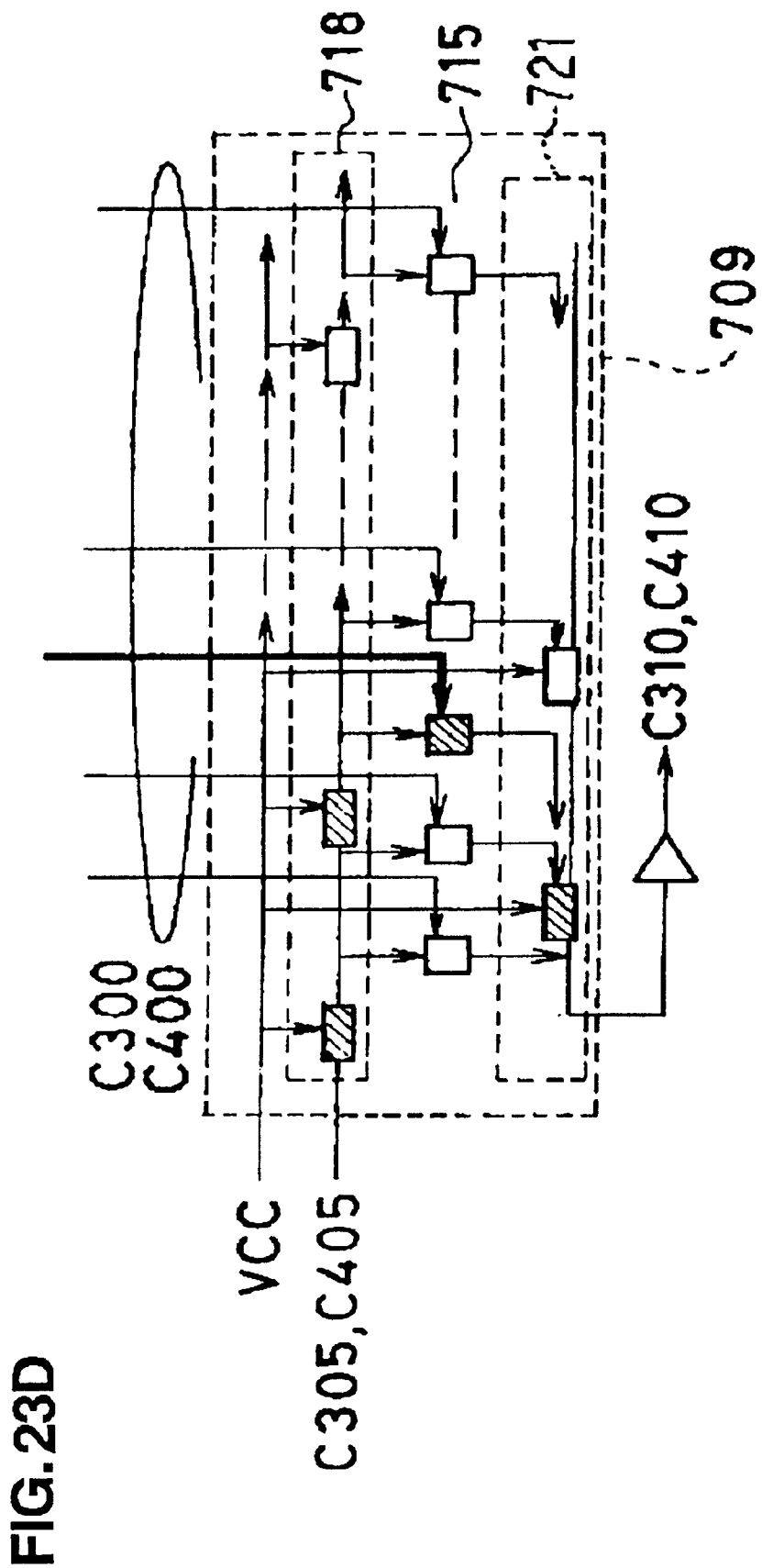
FIG. 23D is a circuit diagram of another example of a cycle delay generating circuit.

In the fifth embodiment, a first delay generating circuit 707, a second delay generating circuit 708, and a cycle delay generating circuit 709 are designed to have the same structure. With reference to FIGS. 23B to 23D, each of the first delay generating circuit 707, the second delay generating circuit 708, and the cycle delay generating circuit 709 is comprised of a row of switching circuits 713, 714, and 715, and a row of delay circuits 716, 717, and 718, respectively.

In accordance with the fifth embodiment, a loop or return point in each of the rows of delay circuits 716, 717, and 718 is selected through each of the rows of switching circuits 713, 714, and 715.

The fifth embodiment makes it possible to reproduce delay time almost equal to a cycle of a clock signal detected by the clock cycle detecting circuit 6.

In addition, since the fifth embodiment selects a loop point for reproducing the delay time, a secondary advantage is ensured that input or output load is reduced with the result of reduction in power consumption.

[Sixth Embodiment]

In the above-mentioned second to fifth embodiments, delay time almost equal to a cycle of a clock signal detected by the clock cycle detecting circuit 6 is reproduced by determining a length of each of the rows of delay circuits 506, 507, 508, 616, 617, and 618. As mentioned hereinbelow, the delay time can be reproduced also by charging a capacity through MOS transistors.

Specifically, the circuit in accordance with the sixth embodiment is designed to select a capacity to be connected to an output of MOS transistor in line with the output signals C300 or C400 transmitted from the clock cycle detecting circuit 6.

Figure 24:
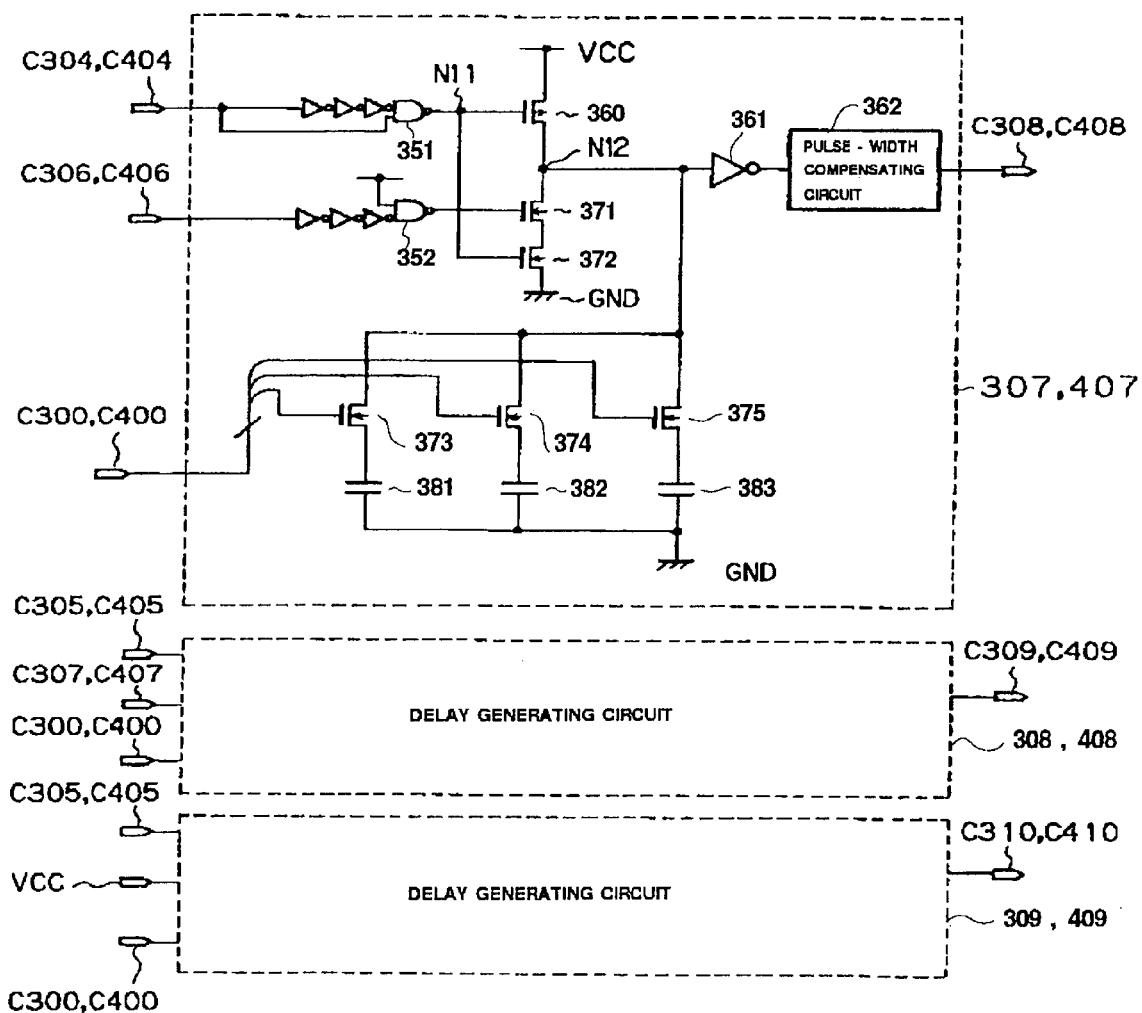
FIG. 24 is a circuit diagram of still another example of a delay generating circuit.

As illustrated in FIG. 24, the first and second delay generating circuits 307 (or 407) and 308 (or 408), and the cycle delay generating circuit 309 (or 409) are designed to have the same structure in the circuit in accordance with the sixth embodiment.

The first delay generating circuit 307 is comprised of first and second NAND circuits 351 and 352, a p-channel MOS transistor 360, first to fifth n-channel MOS transistors 371 to 375, first to third capacitors 381 to 383, an inverter 361, and a circuit 362 for compensating for a pulse width.

The p-channel MOS transistor 360, the first n-channel MOS transistor 371, and the second n-channel MOS transistor 372 are connected in series between a source voltage VCC and the ground GND. The first NAND circuit 351 transmits an output signal to gates of the p-channel MOS transistor 360 and the second n-channel MOS transistor 372. The second NAND circuit 352 transmits an output signal to a gate of the first n-channel MOS transistor 371.

Gates of the third to fifth n-channel MOS transistors 373, 374, and 375 are connected to one another. Drains of the third to fifth n-channel MOS transistors 373, 374, and 375 are connected to one another, and further to a connection node N12 through which the p-channel MOS transistor 360 is connected to the first n-channel MOS transistor 371.

The first to third capacitors 381, 382, and 383 are connected at one ends to the ground GND, and at other ends to sources of the third to fifth n-channel MOS transistors 373, 374, and 375.

The clock signal C300 (or C400) transmitted from the clock cycle detecting circuit 6 is input into the gates of the third to fifth n-channel MOS transistors 373, 374, and 375. The clock signal C304 (or c404) is inverted and delayed by means of an odd number of inverters, and then, is input into the gates of the p-channel MOS transistor 360 and the second n-channel MOS transistor 372 through the first NAND circuit 351. The clock signal C306 (or C406) inverted and delayed by means of an odd number of inverters. The thus inverted clock signal C306 (or C406) and the source voltage VCC are input into the gate of the first n-channel MOS transistor 371 through the second NAND circuit 352.

Then, the clock signals C300 (or C400), C304 (or c404), and C306 (or C406) are transmitted into the circuit 362 through the inverter 361, and are output as the clock signals C308 (or C408).

As mentioned earlier, the second delay generating circuit 308 and the cycle delay generating circuit 309 are designed to have the same structure as that of the first delay generating circuit 307. However, the cycle delay generating circuit 309 is designed to have a terminal connected to the source voltage VCC, which terminal corresponds to a terminal through which the clock signal C306 (or C406) is input into the first delay generating circuit 307. In other words, the first n-channel MOS transistor 371 is kept turned on in the cycle delay generating circuit 309.

The sixth embodiment makes it possible to reproduce delay time almost equal to a cycle of a clock signal detected by the clock cycle detecting circuit 6.

In addition, each of MOS transistors in the sixth embodiment carries out the same operation as an operation carried out by each one of the rows of delay circuits in the above-mentioned second to fifth embodiments. Hence, the sixth embodiment provides the secondary advantages such as reduction in a circuit area and reduction in power consumption.

[Seventh Embodiment]

Similarly to the sixth embodiment, the circuit in accordance with the seventh embodiment is designed to select a capacity to be connected to an output of MOS transistor in line with the output signals C300 (or C400) transmitted from the clock cycle detecting circuit 6.

Figure 25:
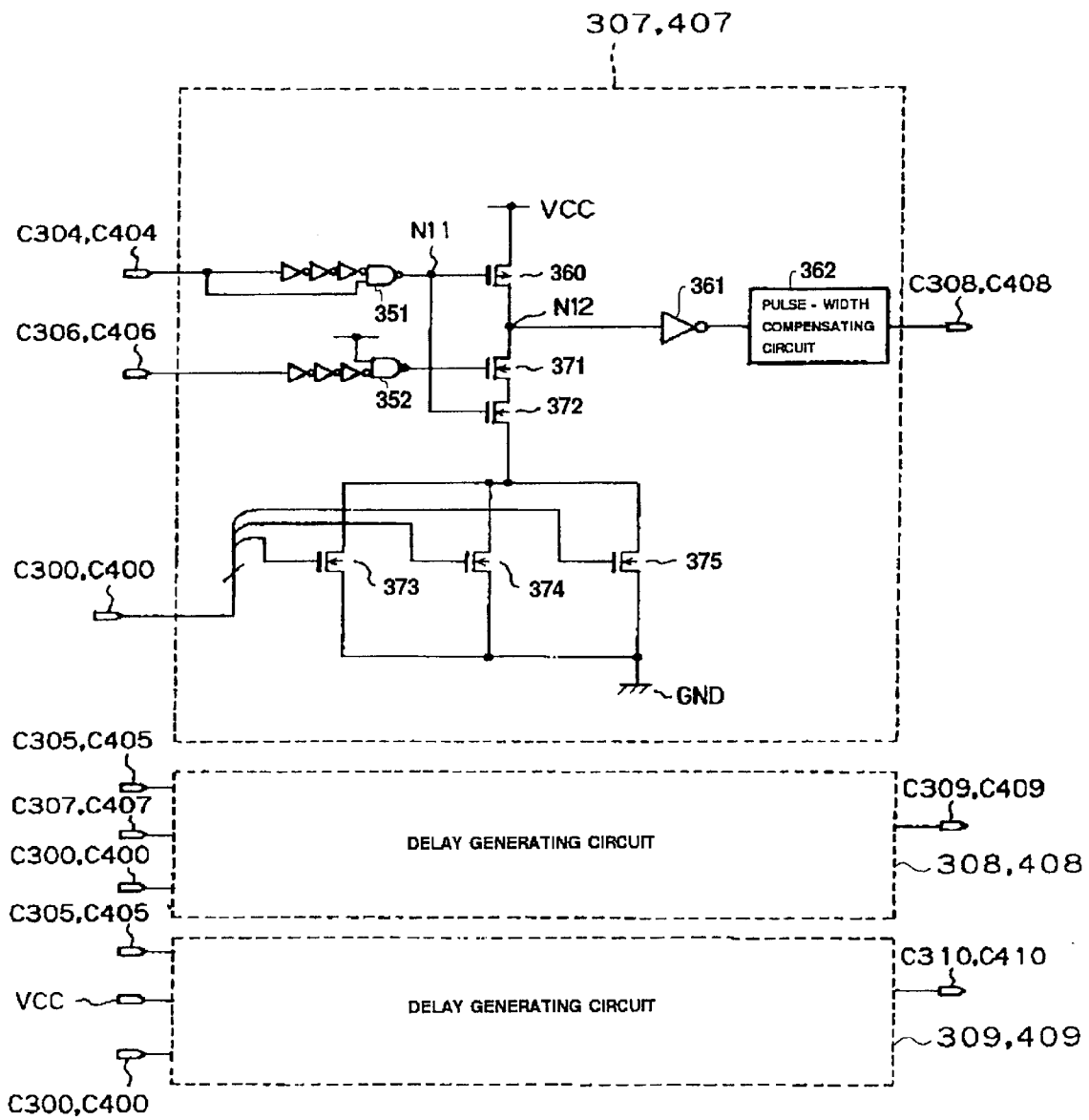
FIG. 25 is a circuit diagram of yet another example of a delay generating circuit.

As illustrated in FIG. 25, the first and second delay generating circuits 307 (or 407) and 308 (or 408), and the cycle delay generating circuit 309 (or 409) are designed to have the same structure in the circuit in accordance with the seventh embodiment.

As will be obvious in comparison with FIG. 24, the first delay generating circuit 307 in the seventh embodiment is almost the same in structure as the first delay generating circuit 307 in the sixth embodiment except that the first to third capacitors 381, 382, and 383 are omitted.

That is, the first delay generating circuit 307 is comprised of first and second NAND circuits 351 and 352, a p-channel MOS transistor 360, first to fifth n-channel MOS transistors 371 to 375, an inverter 361, and a circuit 362 for compensating for a pulse width.

The p-channel MOS transistor 360, the first n-channel MOS transistor 371, and the second n-channel MOS transistor 372 are connected in series between a source voltage VCC and drains of the third to fifth n-channel MOS transistors 373, 374, and 375. The first NAND circuit 351 transmits an output signal to gates of the p-channel MOS transistor 360 and the second n-channel MOS transistor 372. The second NAND circuit 352 transmits an output signal to a gate of the first n-channel MOS transistor 371.

Gates of the third to fifth n-channel MOS transistors 373, 374, and 375 are connected to one another. Drains of the third to fifth n-channel MOS transistors 373, 374, and 375 are connected to one another, and further to a source of the second n-channel MOS transistor 372. Sources of the third to fifth nchannel MOS transistors 373, 374, and 375 are connected to one another, and further to the ground GND.

The clock signal C300 (or C400) transmitted from the clock cycle detecting circuit 6 is input into the gates of the third to fifth n-channel MOS transistors 373, 374, and 375. The clock signal C304 (or c404) is inverted and delayed by means of an odd number of inverters, and then, is input into the gates of the p-channel MOS transistor 360 and the second n-channel MOS transistor 372 through the first NAND circuit 351. The clock signal C306 (or C406) inverted and delayed by means of an odd number of inverters. The thus inverted clock signal C306 (or C406) and the source voltage VCC are input into the gate of the first n-channel MOS transistor 371 through the second NAND circuit 352.

Then, the clock signals C300 (or C400), C304 (or c404), and C306 (or C406) are transmitted into the circuit 362 through the inverter 361, and are output as the clock signals C308 (or C408).

Similarly to the sixth embodiment, the cycle delay generating circuit 309 is designed to have a terminal connected to the source voltage VCC, which terminal corresponds to a terminal through which the clock signal C306 (or C406) is input into the first delay generating circuit 307. In other words, the first nchannel MOS transistor 371 is kept turned on in the cycle delay generating circuit 309.

The seventh embodiment makes it possible to reproduce delay time almost equal to a cycle of a clock signal detected by the clock cycle detecting circuit 6.

In addition, each of MOS transistors in the seventh embodiment carries out the same operation as an operation carried out by each one of the rows of delay circuits in the above-mentioned second to fifth embodiments. Hence, the seventh embodiment provides the secondary advantages such as reduction in a circuit area and reduction in power consumption.

In the circuit in accordance with the seventh embodiment, the n-channel MOS transistors and the p-channel MOS transistors may be replaced with each other.

While the present invention has been described in connection with the preferred embodiments, the present invention provides the following advantages.

Figure 1:
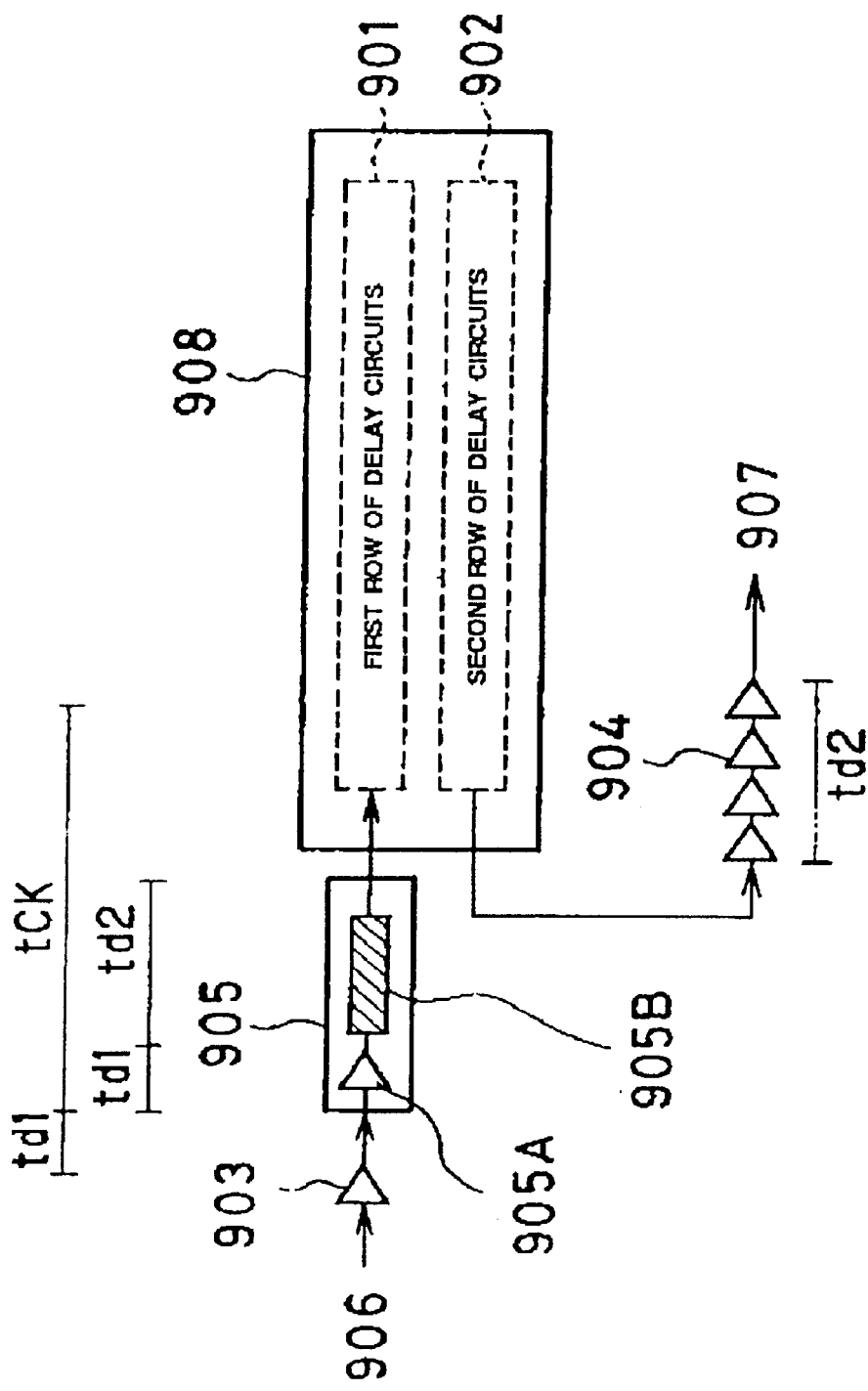
FIG. 1 is a circuit diagram of a conventional circuit for controlling a clock signal, including a synchronization delay circuit.
Figure 2:
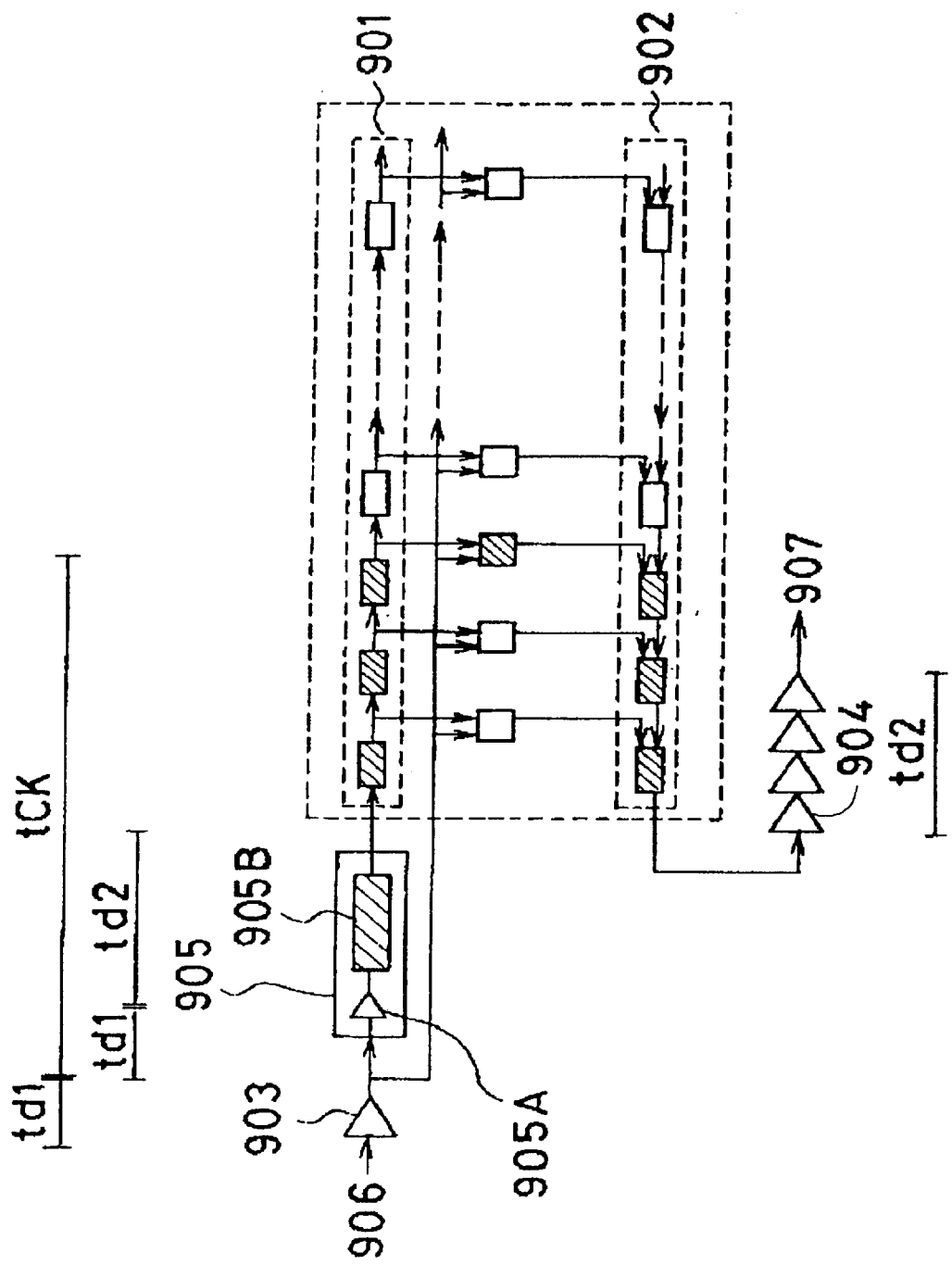
FIG. 2 is a circuit diagram of a first conventional synchronization delay circuit.
Figure 3:
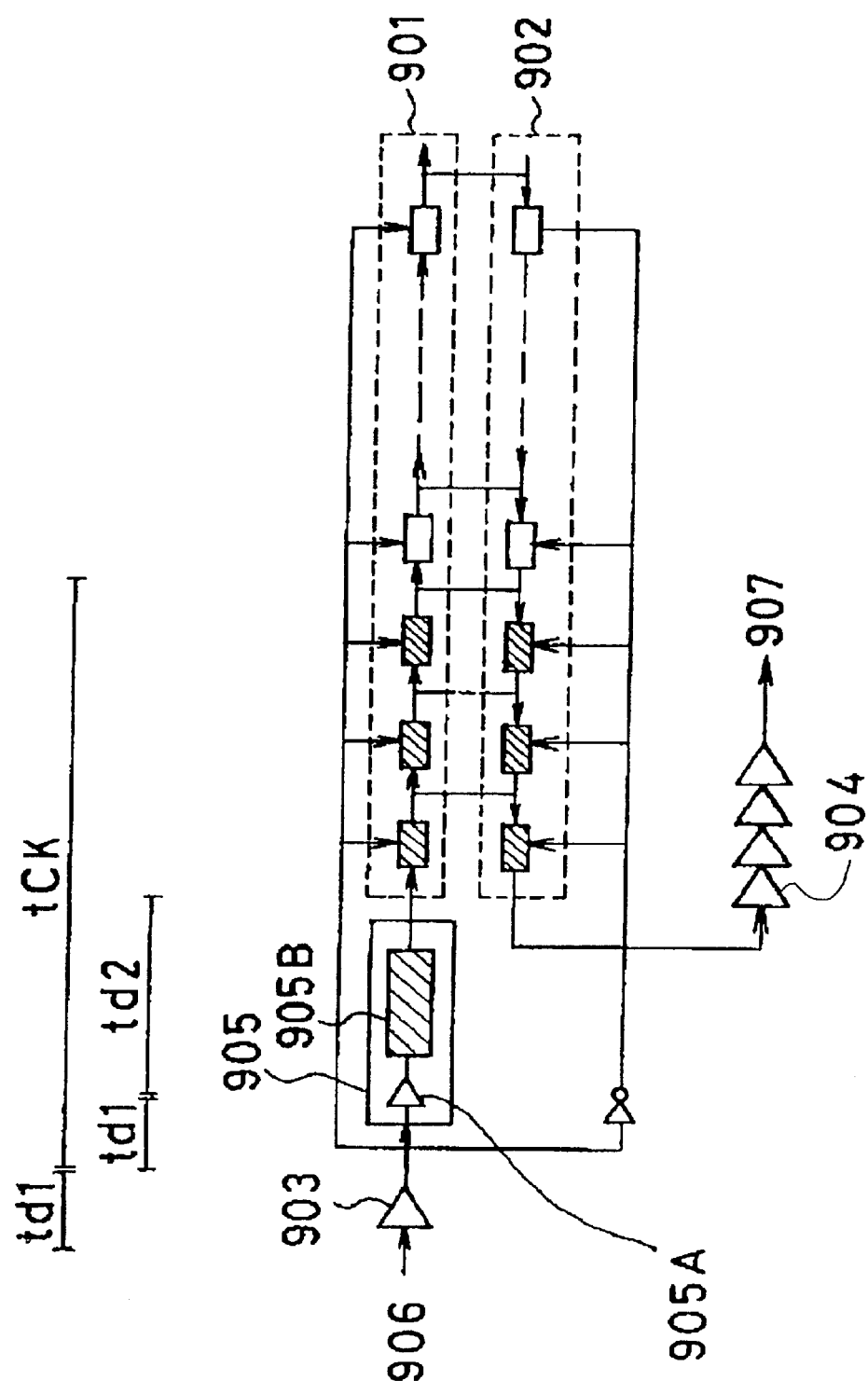
FIG. 3 is a circuit diagram of a second conventional synchronization delay circuit.
Figure 4:
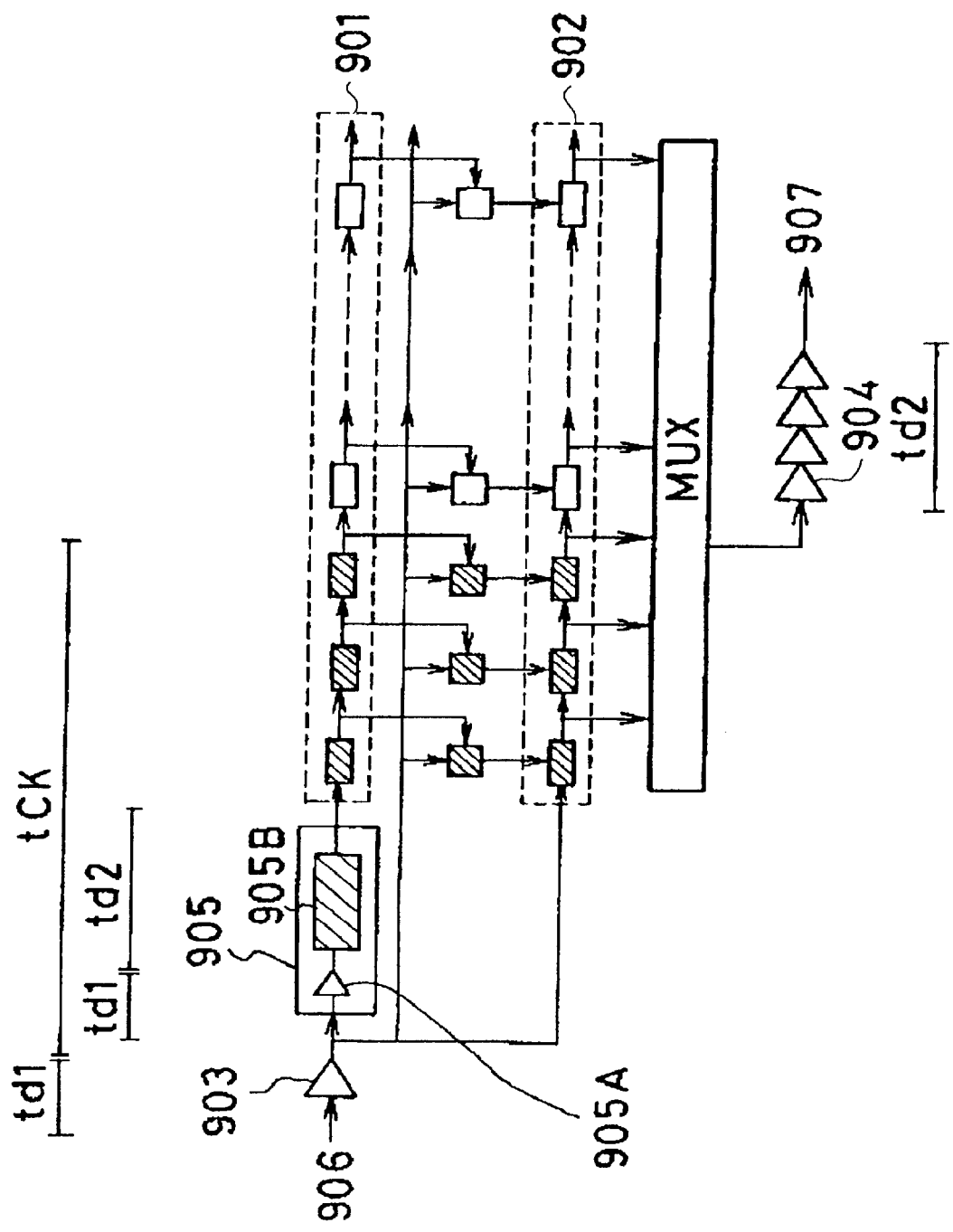
FIG. 4 is a circuit diagram of a third conventional synchronization delay circuit.
Figure 5:
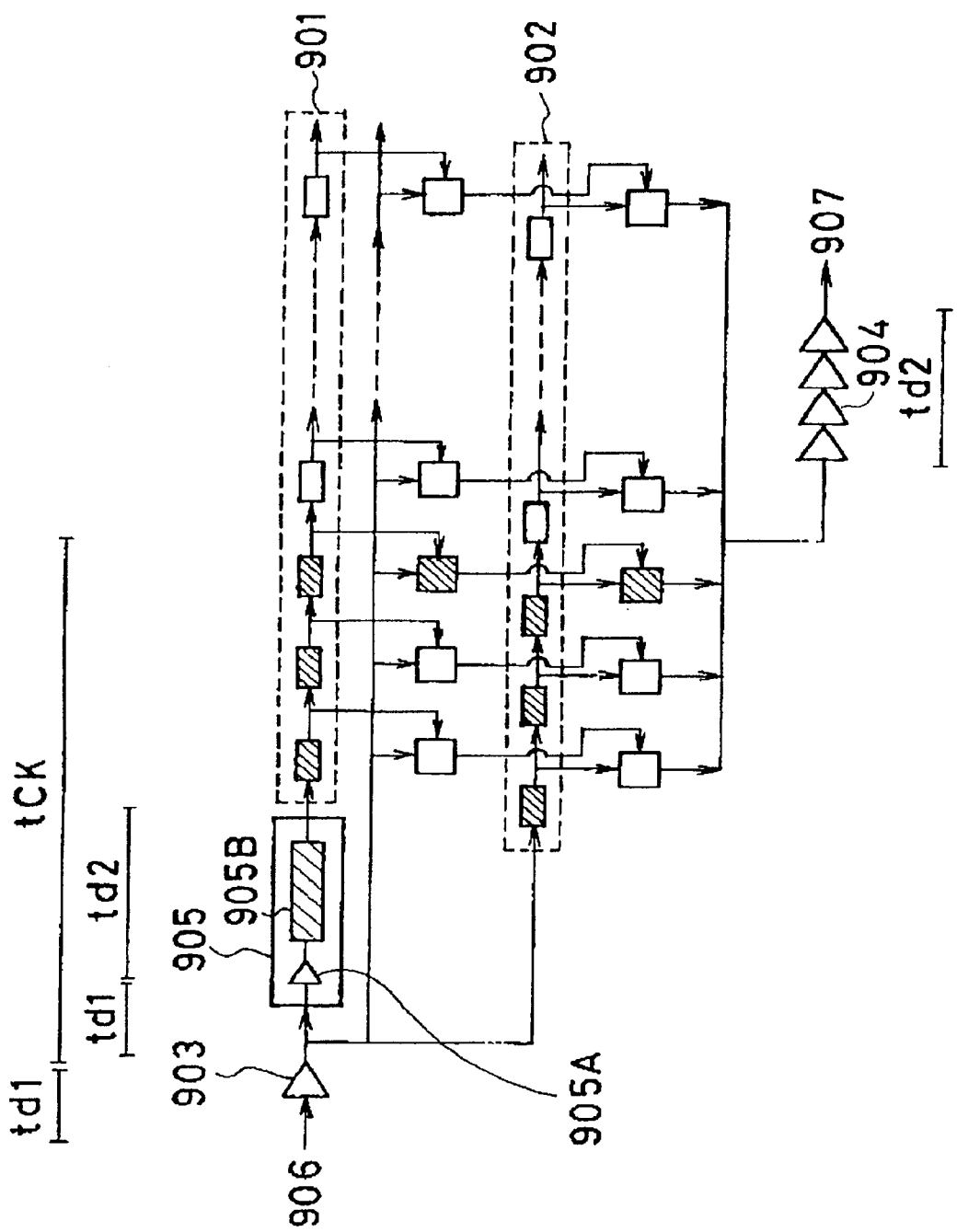
FIG. 5 is a circuit diagram of a fourth conventional synchronization delay circuit.
Figure 6A:
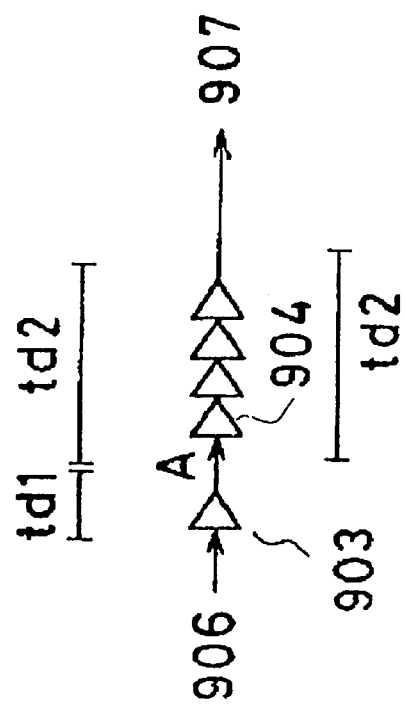
FIG. 6A is a partial circuit diagram of a circuit including an input buffer and a clock driver, to be used for explaining clock skew.
Figure 6B:
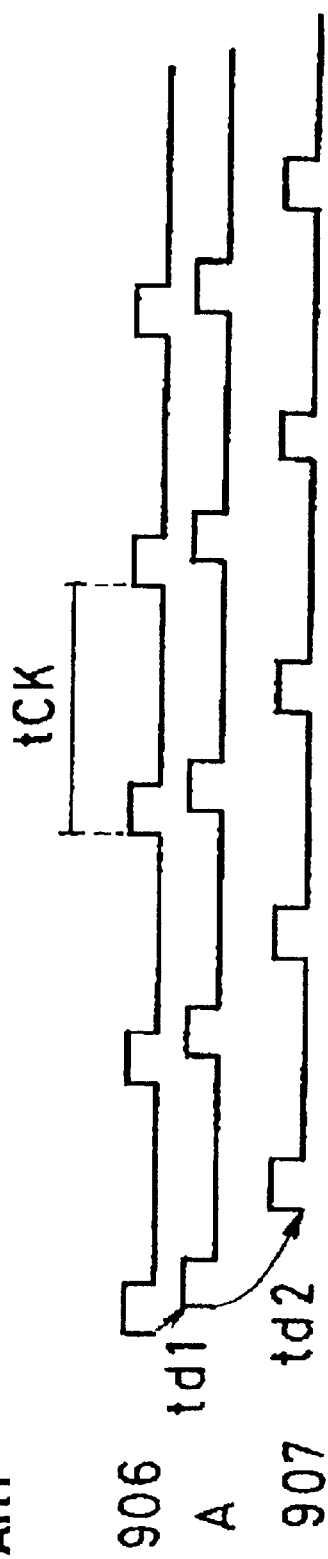
FIG. 6B is a timing chart of the circuit illustrated in FIG. 6A.
Figure 7A:
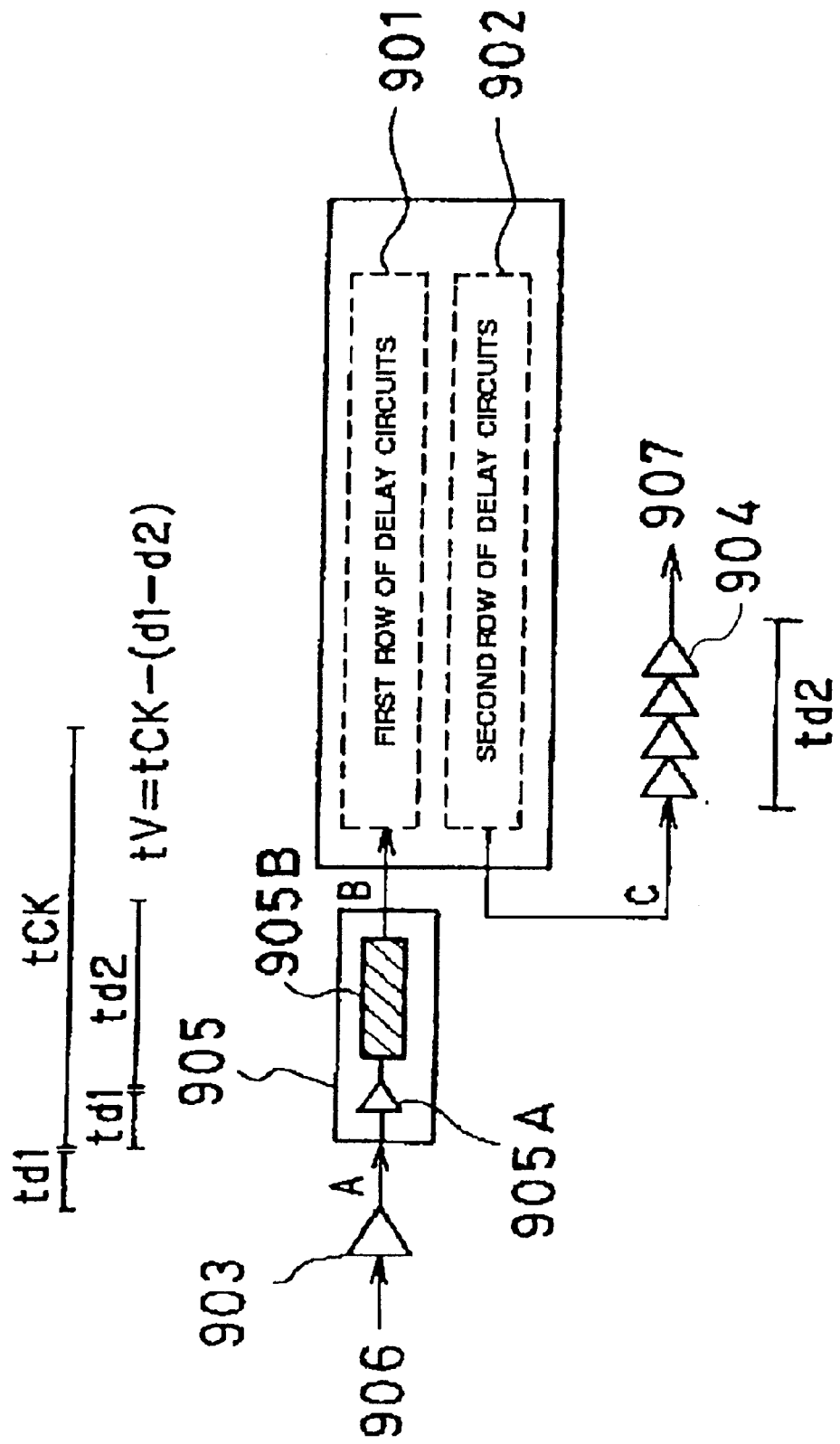
FIG. 7A is a circuit diagram of a circuit for controlling a clock signal, including a synchronization delay circuit.
Figure 7B:
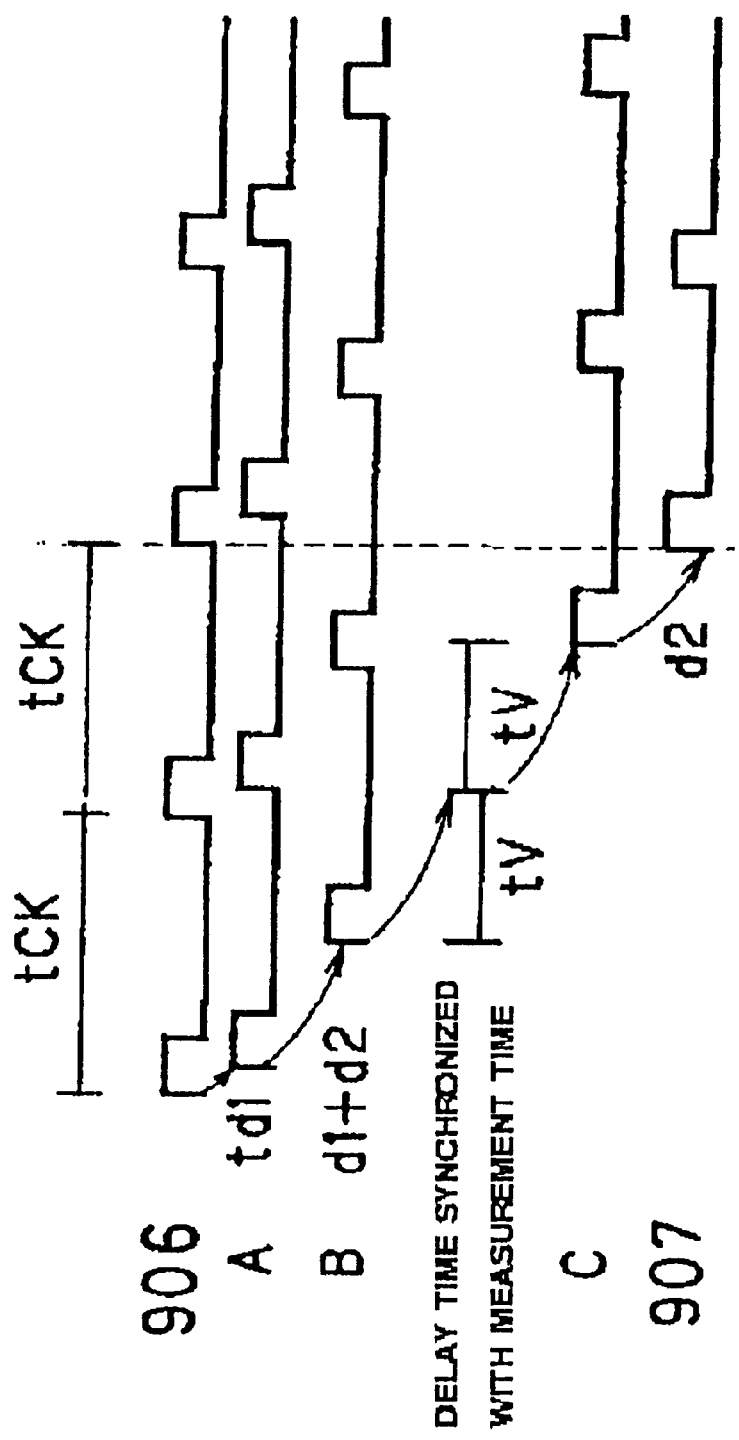
FIG. 7B is a timing chart of the circuit illustrated in FIG. 7A.
Figure 8A:
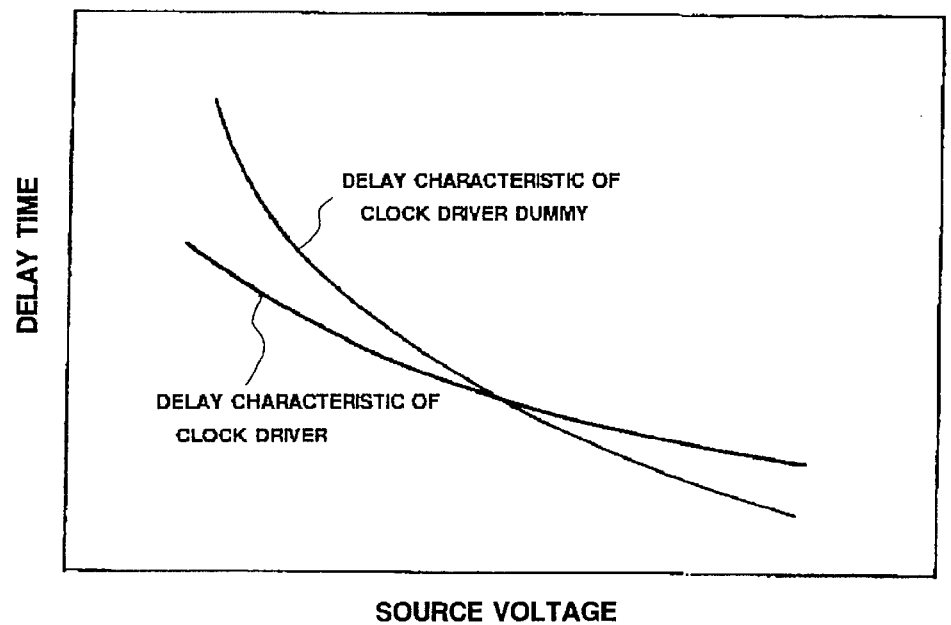
FIG. 8A is a graph showing dependency of delay time on source voltage.
Figure 8B:
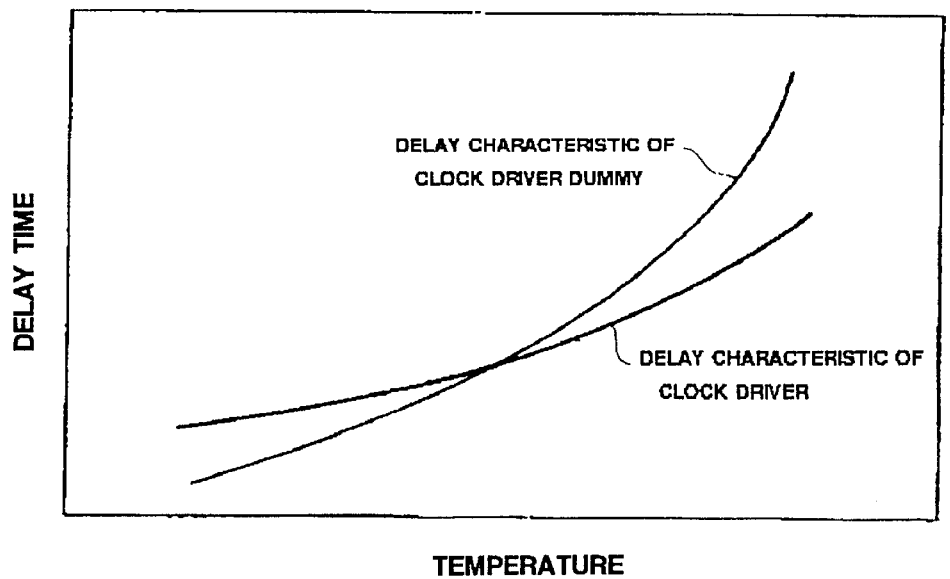
FIG. 8B is a graph showing dependency of delay time on a temperature.
Figure 9:
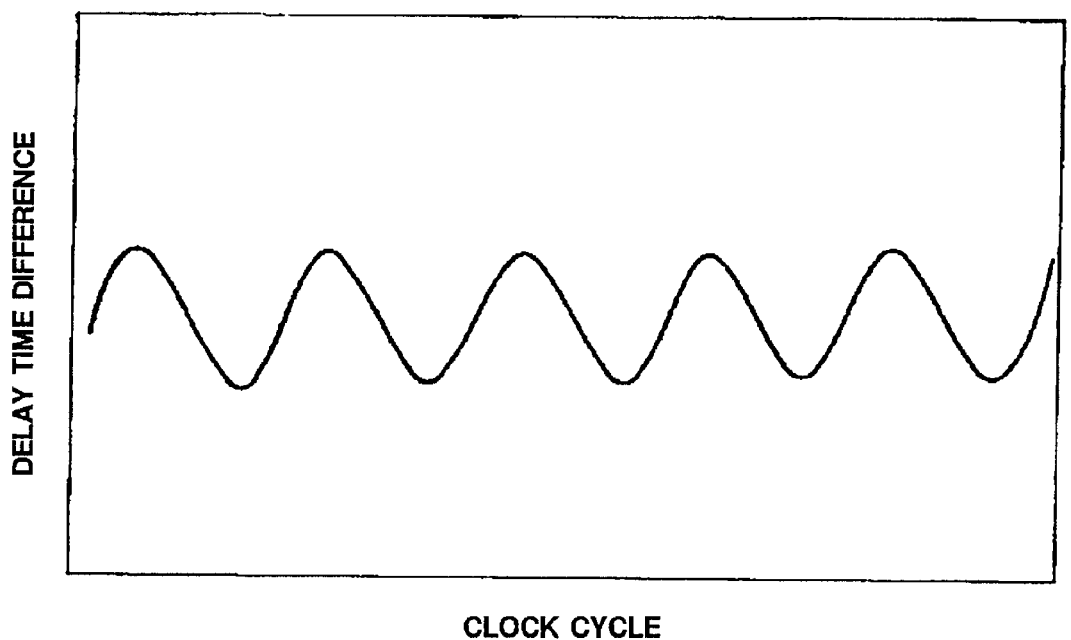
FIG. 9 is a graph showing dependency of delay time error on a clock cycle.

First, since the present invention detects a cycle and delay time of a clock signal, and then, stops the clock signal to be transmitted by the thus detected delay time, the delay time of the clock signal becomes just equal to a multiplied cycle of the clock signal. Hence, it is no longer necessary for the circuit to include a clock driver dummy delay circuit such as the clock driver dummy 905B illustrated in FIG. 1. In addition, the circuit in accordance with the present invention is readily applicable to a device, such as ASIC, which is difficult to estimate clock delay.

Secondly, the present invention detects a time difference among delay circuits having the same structure, when clock delay and cycle are to be detected. Hence, there is not generated an error in delay time inherent to a digital circuit, which error is found in a conventional circuit comprising a delay circuit for detecting delay time and a delay circuit for reproducing the thus detected delay time.

Thirdly, the present invention measures a clock cycle from which actual delay time of a clock driver is subtracted, the circuit properly operates, if delay time of a clock driver is varied due to variation in a temperature of elements constituting the circuit.

Fourthly, by charging a capacity through MOS transistor in order to reproduce delay time almost equal to a cycle of a clock signal detected by the clock cycle detector, it would be possible to reduce load relative to a row of delay circuits.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-64335 filed on Feb. 27, 1998 including specification, claims, drawings and summary is incorporated herein by reference in its entirety.

What is claimed is:

1. A method of controlling a clock, comprising the steps of:
   (a) receiving an external clock signal;
   (b) calculating a first period of time, based on a signal received directly from an output of a clock-delay compensator, defined as (T1−T2) wherein T1 is a cycle of said external clock signal, and T2 is a period of time during which said external clock signal is transmitted through devices generating skew to said external clock signal;
   (c) stopping said external clock signal to be transmitted by said first period of time; and
   (d) driving said external clock signal to thereby turn said external clock signal into an internal clock signal.

2. The method as set forth in claim 1, wherein a second period of time defined as (T1−(T2−N×T1)) is calculated in said step (b), if T1 is smaller than T2, wherein N is an integer meeting with the equation T1>(T2−N×T1), and wherein said external clock signal is stopped to be transmitted by said second period of time in step (c).

3. A circuit for controlling a clock signal, comprising:
   (a) an input buffer for receiving an external clock signal and providing a first output clock signal;
   (b) a clock-delay detector for receiving said first output clock signal, detecting a first period of time defined as (T1−T2) wherein T1 is a cycle of said external clock signal, and T2 is a period of time during which said external clock signal is transmitted through devices generating skew to said external clock signal, and for providing a stop signal by said first period of time, wherein said clock-delay detector is comprised of a clock cycle detector for detecting said T1 period of time, and a skew delay detector for detecting said T2 period of time;
   (c) a clock-delay compensator for receiving said first output clock signal, and receiving said stop signal from said clock delay detector, and for stopping said first output clock signal to be transmitted by said first period of time, and providing a second output clock signal directly to said clock delay detector; and
   (d) a clock driver for receiving said second output clock signal from said clock delay compensator and for driving said second output clock signal to thereby turn said second output clock signal into an internal clock signal.

4. The circuit as set forth in claim 3, wherein said clock delay detector detects a second period of time defined as (T1−(T2−N×T1)), if T1 is smaller than T2, wherein N is an integer meeting with the equation T1>(T2−N×T1), and wherein said compensator stops said first output clock signal to be transmitted by said second period of time.

5. A circuit for controlling a clock signal, comprising:
   (a) an input buffer for receiving an external clock signal and providing a first output clock signal;
   (b) a clock delay detector for receiving said first output clock signal, detecting a first period of time defined as (T1−T2) wherein T1 is a cycle of said external clock signal, and T2 is a period of time during which said external clock signal is transmitted through devices generating skew to said external clock signal, and transmitting a stop signal by said first period of time;
   (c) a clock-delay compensator for receiving said first output clock signal, and receiving said stop signal from said clock delay detector, and for stopping said first output clock signal to be transmitted by said first period of time;
   (d) a clock driver for receiving and driving an output signal transmitted from said clock-delay compensator to thereby turn said output signal into an internal clock signal; and
   (e) an input buffer dummy equivalent to said input buffer for receiving said internal clock signal, said clock delay detector including:
   (ba) a clock cycle detector for detecting a clock cycle of said first output clock signal transmitted from said input buffer; and
   (bb) a skew delay detector for detecting skew delay in each of said input buffer and said clock driver, said skew delay detector including:
   (bb1) a first timing difference detector for transmitting a clock signal having a pulse width indicative of a time difference defined at (td1+td2) wherein td1 indicates delay time of said input buffer and td2 indicates delay time of said clock driver;
   (bb2) a clock cycle detector dummy having the same delay time td3 as that of said clock cycle detector and receiving said first output clock signal;
   (bb3) a divider for dividing both said first output clock signal and an output clock signal transmitted from said clock cycle detector dummy to thereby transmit complementary clock signals each having a cycle of 2×T1 and a pulse width defined as (T1+td3), and each having a leading edge equal to that of said first output clock signal and a trailing edge delayed from that of said first output clock signal by td3;

(bb4) first and second synthesizers for synthesizing said complementary clock signals and said clock signal transmitted from said first timing difference detector to thereby transmit output signals each having a cycle of 2×T1 and also having an active level period defined as (td1+td2+T1+td3);

(bb5) first and second control gates each receiving said complementary clock signals to thereby be controlled as to receiving said first output clock signal;

(bb6) first and second delay generators each including a plurality of switches one of which is turned on when receiving an output clock signal transmitted from said clock cycle detector, and a plurality of delay circuits, each of said first and second delay generators receiving both output clock signals transmitted from said first and second control gates and output clock signals transmitted from said first and second synthesizers, said output clock signals transmitted from said first and second control gates being controlled by said output clock signals transmitted from said first and second synthesizers as to advancing and stopping in said delay circuits;

(bb7) a cycle delay generator including a plurality of switches one of which is turned on when receiving an output signal transmitted from said clock cycle detector, and a plurality of delay circuits, said cycle delay generator receiving said first output clock signal, which is looped at a position associated with the turned-on switch, and is transmitted in said delay circuits towards an output port;

(bb8) a third synthesizer for synthesizing output signals transmitted from said first and second delay generators; and (bb9) a second timing difference detector for detecting a difference between an output signal transmitted from said third synthesizer and an output signal transmitted from said cycle delay generator, and transmitting a signal indicative of the thus detected difference to said clock-delay compensator as said stop signal.

6. The circuit as set forth in claim 5, wherein at least one of said first, second and cycle delay generators is comprised of a plurality of MOS transistors at least one of which is turned on when receiving an output signal transmitted from said clock cycle detector, said first period of time being comprised of a period of time in which the turned-on MOS transistor is charged.

7. The circuit as set forth in claim 5, wherein at least one of said first, second and cycle delay generators is comprised of a plurality of switches one of which is turned on when receiving an output signal transmitted from said clock cycle detector, and a plurality of delay circuits, and wherein a clock signal input into said delay circuits is output from a delay circuit among said delay circuits, associated with the turned-on switch.

8. The circuit as set forth in claim 5, wherein at least one of said first, second and cycle delay generators is comprised of a plurality of first delay circuits, a plurality of second delay circuits in which a clock signal is transmitted in a direction opposite to a direction in which a clock signal is transmitted in said first delay circuits, and a plurality of switches one of which is turned on when receiving an output signal transmitted from said clock cycle detector, a clock signal input thereinto being transmitted through said first delay circuits, being input into said second delay circuits from a first delay circuit among said first delay circuits, located in association with the turned-on switch, through the turned-on switch, and being transmitted through said second delay circuits toward an output port thereof.

9. A circuit for controlling a clock signal, comprising:

(a) an input buffer for receiving an external clock signal and providing a first output clock signal;

(b) a clock delay detector for receiving said first output clock signal, detecting a first period of time defined as (T1−T2) wherein T1 is a cycle of said external clock signal, and T2 is a period of time during which said external clock signal is transmitted through devices generating skew to said external clock signal, and transmitting a stop signal by said first period of time;

(c) a clock-delay compensator for receiving said first output clock signal, and receiving said stop signal from said clock delay detector, and for stopping said first output clock signal to be transmitted by said first period of time;

(d) a clock driver for receiving and driving an output signal transmitted from said clock-delay compensator to thereby turn said output signal into an internal clock signal; and (e) an input buffer dummy equivalent to said input buffer for receiving said internal clock signal, said clock delay detector including:

(ba) a clock cycle detector for detecting a clock cycle of said first output clock signal transmitted from said input buffer; and (bb) a skew delay detector for detecting skew delay in each of said input buffer and said clock driver, said skew delay detector including:

(bb1) a first timing difference detector for transmitting a clock signal having a pulse width indicative of a time difference defined as (td1+td2) wherein td1 indicates delay time of said input buffer and td2 indicates delay time of said clock driver;

(bb2) a divider for dividing said first output clock signal to thereby transmit complementary clock signals each having a cycle of 2×T1 and a pulse width defined as (T1+α) where α indicates a delay error inherent to a digital circuit, and each having a leading edge equal to that of said first output clock signal and a trailing edge delayed from that of said first output clock signal by (T1+α);

(bb3) first and second synthesizers for synthesizing said complementary clock signals and said clock signal transmitted from said first timing difference detector to thereby transmit output signals each having a cycle of 2×T1 and also having an active level period defined as (td1+td2+T1+α); and (bb4) a cycle delay generator including a plurality of switches one of which is turned on when receiving said first output clock signal, and a plurality of delay circuits, said cycle delay generator receiving said first output clock signal, which is looped at a position associated with the turned-on switch, and is transmitted in said delay circuits toward an output port, said clock delay compensator including:

(c1) first and second control gates each receiving said complementary clock signals to thereby be controlled as to receiving said first output clock signal;

(c2) first and second delay generators each including a plurality of switches one of which is turned on when receiving an output clock signal transmitted from said clock cycle detector, and a plurality of delay circuits, each of said first and second delay generators receiving both output clock signals transmitted from said first and second control gates and output clock signals transmitted from said first and second synthesizers, said output clock signals transmitted from said first and second control gates being controlled by said output clock signals transmitted from said first and second synthesizers as to advancing and stopping in said delay circuits; and (c3) a third synthesizer for synthesizing output signals transmitted from said first and second delay generators, the thus synthesized output signals being transmitted to said clock driver.

10. The circuit as set forth in claim 9, wherein at least one of said first, second and cycle delay generators is comprised of a plurality of MOS transistors at least one of which is turned on when receiving an output signal transmitted from said clock cycle detector, said first period of time being comprised of a period of time in which the turned-on MOS transistor is charged.

11. The circuit as set forth in claim 9, wherein at least one of said first, second and cycle delay generators is comprised of a plurality of switches one of which is turned on when receiving an output signal transmitted from said clock cycle detector, and a plurality of delay circuits, and wherein a clock signal input into said delay circuits is output from a delay circuit among said delay circuits, associated with the turned-on switch.

12. The circuit as set forth in claim 9, wherein at least one of said first, second and cycle delay generators is comprised of a plurality of first delay circuits, a plurality of second delay circuits in which a clock signal is transmitted in a direction opposite to a direction in which a clock signal is transmitted in said first delay circuits, and a plurality of switches one of which is turned on when receiving an output signal transmitted from said clock cycle detector, a clock signal input thereinto being transmitted through said first delay circuits, being input into said second delay circuits from a first delay circuit among said first delay circuits, located in association with the turned-on switch, through the turned-on switch, and being transmitted through said second delay circuits toward an output port thereof.

13. A circuit for controlling a clock signal, comprising:

(a) an input buffer for receiving an external clock signal and providing a first output clock signal;

(b) a clock delay detector for receiving said first output clock signal, detecting a first period of time defined as (T1−T2) wherein T1 is a cycle of said external clock signal, and T2 is a period of time during which said external clock signal is transmitted through devices generating skew of said external clock signal, and transmitting a stop signal by said first period of time;

(c) a clock-delay compensator for receiving said first output clock signal, and receiving said stop signal from said clock delay detector, and for stopping said first output clock signal to be transmitted by said first period of time;

(d) a clock driver for receiving and driving an output signal transmitted from said clock-delay compensator to thereby trun said output signal into an internal clock signal; and (e) an input buffer dummy equivalent to said input buffer for receiving said internal clock signal, said clock delay detector including:

(ba) a clock cycle detector for detecting a clock cycle of said first output clock signal transmitted from said input buffer; and (bb) a skew delay detector for detecting skew delay in each of said input buffer and said clock driver, said skew delay detector including:

(bb1) a first timing difference detector for transmitting a clock signal having a pulse width indicative of a time difference defined as (td1+td2) wherein td1 indicates delay time of said input buffer and td2 indicates delay time of said clock driver;

(bb2) a clock cycle detector dummy having the same delay time td3 as that of said clock cycle detector and receiving said first output clock signal;

(bb3) a divider for dividing both said first output clock signal and an output clock signal transmitted from said clock cycle detector dummy to thereby transmit complementary clock signals each having a cycle of 2×T1 and a pulse width defined as (T1+td3), and each having a leading edge equal to that of said first output clock signal and at trailing edge delayed from that of said first output clock signal by td3;

(bb4) first and second synthesizers for synthesizing said complementary clock signals and said clock signal transmitted from said first timing difference detector to thereby transmit output signals each having a cycle of 2×T1 and also having an active level period defined at (td1+td2+T1+td3);

(bb5) a control gate receiving said complementary clock signals to thereby be controlled as to receiving said first output clock signal;

(bb6) a delay generator including a plurality of switches one of which is turned on when receiving an output clock signal transmitted from said clock cycle detector, and a plurality of delay circuits, said delay generator receiving both output clock signal transmitted from said control gate and output clock signals transmitted from said first and second synthesizers, said output clock signal transmitted from said control gate being controlled by said output clock signals transmitted from said first and second synthesizers as to advancing and stopping in said delay circuits;

(bb7) a cycle delay generator including a plurality of switches one of which is turned on when receiving an output signal transmitted from said clock cycle detector, and a plurality of delay circuits, said cycle delay generator receiving said first output clock signal, which is looped at a position associated with the turned-on switch, and is transmitted in said delay circuits toward an output port;

(bb8) a multiplier for multiplying an output signal transmitted from said delay generator, by a certain number; and (bb9) a second timing difference detector for detecting a difference between an output signal transmitted from said multiplier and an output signal transmitted from said cycle delay generator, and transmitting a signal indicative of the thus detected difference to said clock-delay compensator as said stop signal.

14. A circuit for controlling a clock signal, comprising:

(a) an input buffer for receiving an external clock signal and providing a first output clock signal;

(b) a clock delay detector for receiving said first output clock signal, detecting a first period of time defined as (T1−T2) wherein T1 is a cycle of said external clock signal, and T2 is a period of time during which said external clock signal is transmitted through devices generating skew to said external clock signal, and transmitting a stop signal by said first period of time;

(c) a clock-delay compensator for receiving said first output clock signal, and receiving said stop signal from said clock delay detector, and for stopping said first output clock signal to be transmitted by said first period of time;

(d) a clock driver receiving and driving an output signal transmitted from said clock-delay compensator to thereby turn said output signal into an internal clock signal; and
(e) an input buffer dummy equivalent to said input buffer for receiving said internal clock signal, said clock delay detector including:

(ba) a clock cycle detector for detecting a clock cycle of said first output clock signal transmitted from said input buffer; and
(bb) a skew delay detector for detecting skew delay in each of said input buffer and said clock driver, said skew delay detector including:

(bb1) a first timing difference detector for transmitting a clock signal having a pulse width indicative of a time difference defined at (td1+td2) wherein td1 indicates delay time of said input buffer and td2 indicates delay time of said clock driver;
(bb2) a clock cycle detector dummy having the same delay time td3 as that of said clock cycle detector and receiving said first output clock signal;
(bb3) a divider for dividing both said first output clock signal and an output clock signal transmitted from said clock cycle detector dummy to thereby transmit complementary clock signals each having a cycle of 2×T1 and a pulse width defined as (T1+td3), and each having a leading edge equal to that of said first output clock signal and a trailing edge delayed from that of said first output clock signal by td3;
(bb4) first and second synthesizers for synthesizing said complementary clock signals and said clock signal transmitted from said first timing difference detector to thereby transmit output signals each having a cycle of 2×T1 and also having an active level period defined as (td1+td2+T1+td3);
(bb5) a timing signal generator for generating a timing signal having a duty ratio of 50;
(bb6) a delay generator including a plurality of switches one of which is turned on when receiving an output clock signal transmitted from said clock cycle detector, and a plurality of delay circuits, said delay generator receiving both an output clock signal transmitted from said timing signal generator and outout clock signals transmitted from said first and second synthesizers, said output clock signal transmitted from said timing signal generator being controlled by said output clock signals transmitted from said first and second synthesizers as to advancing and stopping in said delay circuits;
(bb7) a cycle delay generator including a plurality of switches one of which is turned on when receiving an output signal transmitted from said clock cycle detector, and a plurality of delay circuits, said cycle delay generator receiving said first output clock signal, which is looped at a position associated with the turned-on switch, and is transmitted in said delay circuits toward an output port;
(bb8) a second timing difference detector for detecting a difference between an output signal transmitted from said delay generator, and transmitting a signal indicative of the thus detected difference to said clock-delay compensator as said stop signal.

15. A circuit for controlling a clock signal, comprising:

(a) an input buffer for receiving an external clock signal and providing a first output clock signal;
(b) a clock delay detector for receiving said first output clock signal, detecting a first period of time defined as (T1−T2) wherein T1 is a cycle of said external clock signal, and T2 is a period of time during which said external clock signal is transmitted through devices generating skew to said external clock signal, and transmitting a stop signal by said first period of time;
(c) a clock-delay compensator for receiving said first output clock signal, and receiving said stop signal from said clock delay detector, and for stopping said first output clock signal to be transmitted by said first period of time;
(d) a clock driver for receiving and driving an output signal transmitted from said clock-delay compensator to thereby turn said output signal into an internal clock signal; and
(e) an input buffer dummy equivalent to said input buffer for receiving said internal clock signal, said clock delay detector including:

(ba) a clock cycle detector for detecting a clock cycle of said first output clock signal transmitted from said input buffer; and
(bb) a skew delay detector for detecting skew delay in each of said input buffer and said clock driver, said skew delay detector including:

(bb1) a first timing difference detector for transmitting a clock signal having a pulse width indicative of a time difference defined as (td1+td2) wherein td1 indicates delay time of said input buffer and td2 indicates delay time of said clock driver;
(bb2) a divider for dividing said first output clock signal to thereby transmit complementary clock signals each having a cycle of 2×T1 and a pulse width defined as (T1+α) where α indicates a delay error inherent to a digital circuit, and each having a leading edge equal to that of said first output clock signal and a trailing edge delayed from that of said first output clock signal by (T1+α);
(bb3) first and second synthesizers for synthesizing said complementary clock signals and said clock signal transmitted from said first timing difference detector to thereby transmit output signals each having a cycle of 2×T1 and also having an active level period defined as (td1+td2+T1+α); and
(bb4) a cycle delay generator including a plurality of switches one of which is turned on when receiving said first output clock signal, and a plurality of delay circuits, said cycle delay generator receiving said first output clock signal, which is looped at a position associated with the turned-on switch, and is transmitted in said delay circuits toward an output port;

said clock delay compensator including:

(c1) a timing signal generator for generating a timing signal having a duty ratio of 50; and
(c2) a delay generator including a plurality of switches one of which is turned on when receiving an output clock signal transmitted from said clock cycle detector, and a plurality of delay circuits, said delay generator receiving both output clock signal transmitted from said timing signal generator and output clock signals transmitted from said first and second synthesizers, said output clock signal transmitted from said timing signal generator being controlled by said output clock signals transmitted from said first and second synthesizers as to advancing and stopping in said delay circuits.

* * * * *

UNITED STATES PATENT AND TRADEMARK OFFICE
CERTIFICATE OF CORRECTION

PATENT NO. : 6,437,617 B2
DATED : August 20, 2002
INVENTOR(S) : Saeki

It is certified that error appears in the above-identified patent and that said Letters Patent is hereby corrected as shown below:

Column 29,
Line 58, "trun" should read -- turn --.

Signed and Sealed this

Twenty-second Day of June, 2004

JON W. DUDAS
*Acting Director of the United States Patent and Trademark Office*